(12) United States Patent
Pellizzer et al.

(10) Patent No.: US 9,245,927 B2
(45) Date of Patent: Jan. 26, 2016

(54) SEMICONDUCTOR CONSTRUCTIONS, MEMORY CELLS AND MEMORY ARRAYS

(71) Applicant: Micron Technology, Inc., Boise, ID (US)

(72) Inventors: Fabio Pellizzer, Boise, ID (US); Cinzia Perrone, Bellusco (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/490,395

(22) Filed: Sep. 18, 2014

(65) Prior Publication Data

US 2015/0001461 A1 Jan. 1, 2015

Related U.S. Application Data

(63) Continuation of application No. 13/551,975, filed on Jul. 18, 2012, now Pat. No. 8,853,665.

(51) Int. Cl.
*H01L 29/02* (2006.01)
*H01L 27/24* (2006.01)
*H01L 45/00* (2006.01)

(52) U.S. Cl.
CPC ........ *H01L 27/2463* (2013.01); *H01L 27/2445* (2013.01); *H01L 45/06* (2013.01); *H01L 45/12* (2013.01); *H01L 45/124* (2013.01); *H01L 45/141* (2013.01); *H01L 45/144* (2013.01);
(Continued)

(58) Field of Classification Search
CPC .................................................... H01L 29/02
USPC ...................... 257/2, 4, 5; 438/102
See application file for complete search history.

(56) References Cited

U.S. PATENT DOCUMENTS

| 5,789,277 A | 8/1998 | Zahorik et al. |
| 6,831,330 B2 | 12/2004 | Harshfield |

(Continued)

FOREIGN PATENT DOCUMENTS

| KR | 10-2006-0045790 | 5/2006 |
| KR | 2008-0028544 | 4/2008 |

(Continued)

OTHER PUBLICATIONS

Ziegler et al., CMOS/Nano Co-Design for Crossbar-Based Molecular Electronic Systems; IEEE Transactions on Nanotechnology, vol. 2, No. 4, Dec. 2003, 14 pp.

*Primary Examiner* — David Vu
*Assistant Examiner* — Brandon Fox
(74) *Attorney, Agent, or Firm* — Wells St. John P.S.

(57) ABSTRACT

Some embodiments include a construction having oxygen-sensitive structures directly over spaced-apart nodes. Each oxygen-sensitive structure includes an angled plate having a horizontal portion along a top surface of a node and a non-horizontal portion extending upwardly from the horizontal portion. Each angled plate has an interior sidewall where an inside corner is formed between the non-horizontal portion and the horizontal portion, an exterior sidewall in opposing relation to the interior sidewall, and lateral edges. Bitlines are over the oxygen-sensitive structures, and have sidewalls extending upwardly from the lateral edges of the oxygen-sensitive structures. A non-oxygen-containing structure is along the interior sidewalls, along the exterior sidewalls, along the lateral edges, over the bitlines, and along the sidewalls of the bitlines. Some embodiments include memory arrays, and methods of forming memory cells.

9 Claims, 25 Drawing Sheets

(52) U.S. Cl.
CPC .......... *H01L 45/145* (2013.01); *H01L 45/1666* (2013.01); *H01L 45/1691* (2013.01); *H01L 29/02* (2013.01)

(56) References Cited

U.S. PATENT DOCUMENTS

| | | | |
|---|---|---|---|
| 7,262,502 | B2 | 8/2007 | Chang |
| 7,411,208 | B2 | 8/2008 | Hwang et al. |
| 7,514,288 | B2 | 4/2009 | Lung et al. |
| 7,514,334 | B2 | 4/2009 | Chen et al. |
| 7,569,844 | B2 * | 8/2009 | Lung ............... H01L 45/06 257/2 |
| 7,929,340 | B2 | 4/2011 | Lung et al. |
| 8,030,128 | B1 * | 10/2011 | Sutardja ........... H01L 27/2445 257/3 |
| 8,043,961 | B2 | 10/2011 | Moore et al. |
| 8,053,365 | B2 | 11/2011 | Humayun et al. |
| 8,513,136 | B2 * | 8/2013 | Park et al. .................... 438/717 |
| 2003/0193053 | A1 | 10/2003 | Gilton |
| 2005/0263801 | A1 | 12/2005 | Park et al. |
| 2006/0211165 | A1 | 9/2006 | Hwang et al. |
| 2007/0120107 | A1 | 5/2007 | Hayakawa |
| 2007/0176261 | A1 * | 8/2007 | Lung ............ H01L 27/2436 257/536 |
| 2008/0035961 | A1 | 2/2008 | Chen et al. |
| 2008/0099753 | A1 | 5/2008 | Song et al. |
| 2008/0142773 | A1 | 6/2008 | Campbell |
| 2008/0246116 | A1 | 10/2008 | Mouttet |
| 2008/0303014 | A1 | 12/2008 | Goux et al. |
| 2009/0029031 | A1 | 1/2009 | Lowrey |
| 2009/0072215 | A1 | 3/2009 | Lung et al. |
| 2009/0091971 | A1 | 4/2009 | Dennison et al. |
| 2009/0137080 | A1 | 5/2009 | Chang et al. |
| 2009/0302472 | A1 | 12/2009 | Yoon et al. |
| 2010/0059729 | A1 | 3/2010 | Hudgens |
| 2010/0163817 | A1 | 7/2010 | Savransky et al. |
| 2010/0207095 | A1 | 8/2010 | Lai et al. |
| 2011/0248233 | A1 | 10/2011 | Pellizzer et al. |
| 2011/0278528 | A1 * | 11/2011 | Lung et al. ........................ 257/2 |
| 2012/0019349 | A1 | 1/2012 | Bian |

FOREIGN PATENT DOCUMENTS

| | | |
|---|---|---|
| KR | 10-2009-0090538 | 8/2009 |
| WO | WO 2008/027163 | 3/2008 |
| WO | WO PCT/US2013/048656 | 10/2013 |

* cited by examiner

US 9,245,927 B2

SEMICONDUCTOR CONSTRUCTIONS, MEMORY CELLS AND MEMORY ARRAYS

RELATED PATENT DATA

This patent resulted from a continuation of U.S. patent application Ser. No. 13/551,975 which was filed Jul. 18, 2012, which issued as U.S. Pat. No. 8,853,665, and which is hereby incorporated herein by reference.

TECHNICAL FIELD

Semiconductor constructions, memory cells, memory arrays and methods of forming memory cells.

BACKGROUND

Memory is one type of integrated circuitry, and is used in electronic systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

One type of memory is phase change memory (PCM). Such memory utilizes phase change material as a programmable material. Example phase change materials that may be utilized in PCM are chalcogenide materials.

The phase change material reversibly transforms from one phase to another through application of appropriate stimulus. Each phase may be utilized as a memory state, and thus an individual PCM cell may have two selectable memory states that correspond to two inducible phases of the phase change material.

The phase change materials may be detrimentally affected (i.e., "poisoned") if they are exposed to oxygen, and accordingly it is desired to develop new architectures and fabrication methods which alleviate or prevent such oxygen exposure.

DETAILED DESCRIPTION OF THE ILLUSTRATED EMBODIMENTS

Some embodiments include methods of fabricating non-oxygen containing protective structures adjacent oxygen-sensitive material to alleviate or prevent oxygen poisoning of the oxygen-sensitive material, and some embodiments include new architectures comprising such protective structures. In some embodiments, the oxygen-sensitive material is phase change material (such as, for example, chalcogenide) of PCM. Example embodiments are described with reference to FIGS. 1-37.

Figure 1:
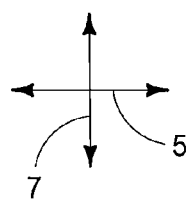
FIGS. 1-3 are a top view and cross-sectional side views of a construction at a processing stage of an example embodiment method. The cross-sectional views of FIGS. 2 and 3 are along the lines A-A and B-B, respectively, of FIG. 1.
Figure 1:
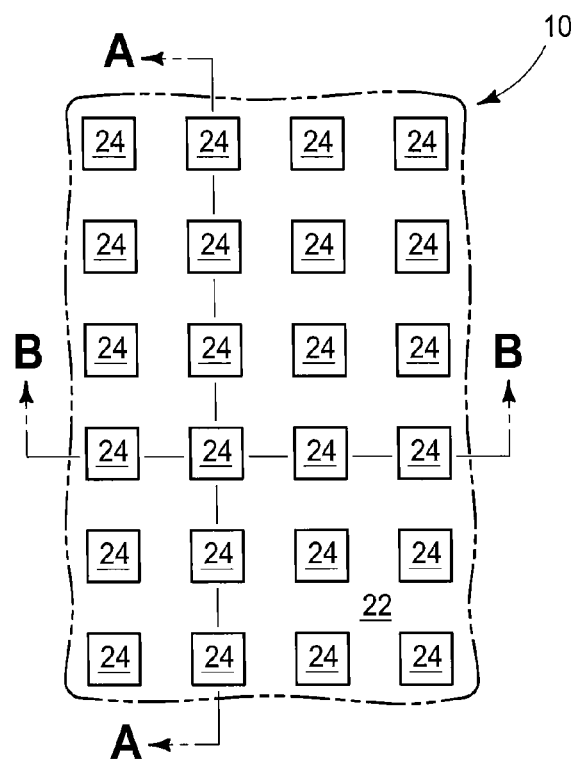
Figure 2:
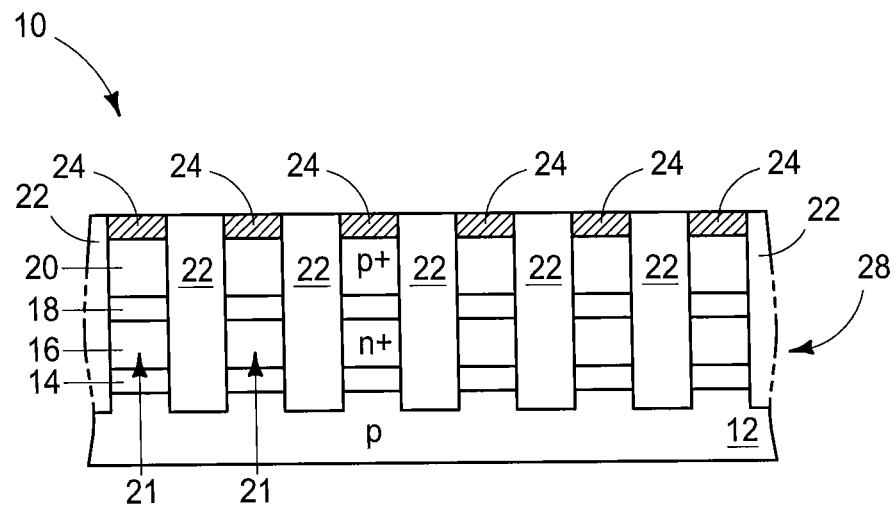
Figure 3:
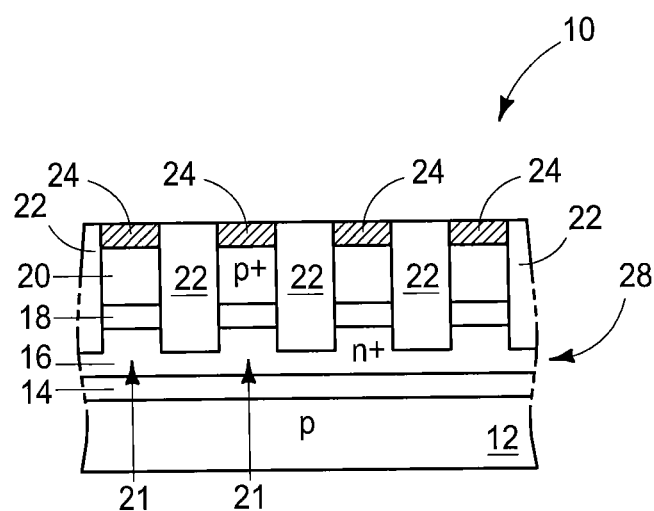

FIGS. 1-3 diagrammatically illustrate a portion of a semiconductor construction 10. FIG. 1 shows a top view of the construction, and FIGS. 2 and 3 show cross-sections along the lines A-A and B-B, respectively, of FIG. 1.

The construction 10 comprises a p-type doped region 12 (which may be referred to as a substrate 12 in some embodiments, and as a collector region 12 in specific embodiments in which it is part of a bipolar junction transistor), and various doped regions 14, 16, 18 and 20 over the region 12. The regions 12, 14, 16 and 18 are patterned into a plurality of pedestals 21 (only some of which are labeled), with such pedestals being separated from one another by intervening dielectric material 22. Material 22 may be alternatively referred to as an electrically insulative material; with the terms "electrically insulative material" and "dielectric material" being synonymous with one another. Material 22 may comprise any suitable composition or combination of compositions, and in some embodiments may comprise oxygen-containing material; such as, for example, silicon dioxide, borophosphosilicate glass (BPSG), phosphosilicate glass (PSG), etc. The doped regions 14, 16, 18 and 20 correspond to doped semiconductor material, such as doped silicon.

The regions 16 and 20 are heavily-doped, and thus are indicated to be n+ doped and p+ doped, respectively. The p-type doped region 12, n-type doped region 16 and p-type doped region 20 together form pn diodes in some embodiments. The regions 14 and 18 are lightly doped, and are utilized as graded junctions to improve performance of such diodes. In some embodiments, the regions 12, 16 and 20 may be regions of bipolar junction transistors.

Electrically conductive material 24 is formed across the tops of the diodes. Such electrically conductive material may comprise any suitable composition or combination of compositions; and in some embodiments may comprise metal silicide (such as, for example, cobalt silicide, titanium silicide, nickel silicide, etc.). Such conductive material may be formed by silicidation of upper surfaces of doped regions 20 in some embodiments. Although the conductive material 24 is shown to have an upper surface substantially coplanar with the upper surface of insulative material 22, in other embodiments the conductive material 24 may have an upper surface which is above or below the upper surface of insulative material 22.

In the shown embodiment, the tops of pedestals 21 are square (as indicated by the square shape of material 24 in the top view of FIG. 1), but in other embodiments the tops of the pedestals may have other shapes; such as, for example, polygonal shapes, round shapes, elliptical shapes, rounded corner shapes, etc.

The pedestals 21 are arranged in a grid (as indicated by the material 24 being arranged in a grid in the top view of FIG. 1). Such grid has a first direction along an axis 5, and a second direction along an axis 7 (with the axes 5 and 7 being illustrated adjacent the top view of FIG. 1). In the shown embodiment, the second direction is substantially orthogonal to the first direction; with the term "substantially orthogonal" meaning that the directions are orthogonal to within reasonable tolerances of fabrication and measurement. The cross-section of FIG. 2 is along axis 7, and that of FIG. 3 is along axis 5.

The cross-sections of FIGS. 2 and 3 show that the pedestals 21 extend deeper along the cross-section of FIG. 2 than along the cross-section of FIG. 3. Specifically, the pedestals extend through regions 14 and 16, and into region 12 along the cross-section of FIG. 2; and extend only partially into region 16 along the cross-section of FIG. 3. In some embodiments, heavily-doped region 16 may be considered to form wordlines which interconnect pluralities of diodes along the direction of axis 5; with an example wordline 28 being illustrated in FIG. 3. As used herein and through the description, "wordline" is a synonym of access line and "bitline" is a synonym of data line.

The illustrated pn diodes are examples of access devices which may be incorporated into a memory array. Other access devices may be utilized in place of, or in addition to, the illustrated diodes in other embodiments. Such other access devices may include, for example, field effect transistors, bipolar junction transistors, PIN diodes, etc.

In some embodiments, construction 10 may be considered to comprise a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. Construction 10 may correspond to a semiconductor substrate containing one or more materials associated with integrated circuit fabrication in some embodiments. Some of the materials may be under the shown region 12 and/or may be laterally adjacent the shown region 12; and may correspond to, for example, one or more of refractory metal materials, barrier materials, diffusion materials, insulator materials, etc.

Figure 4:
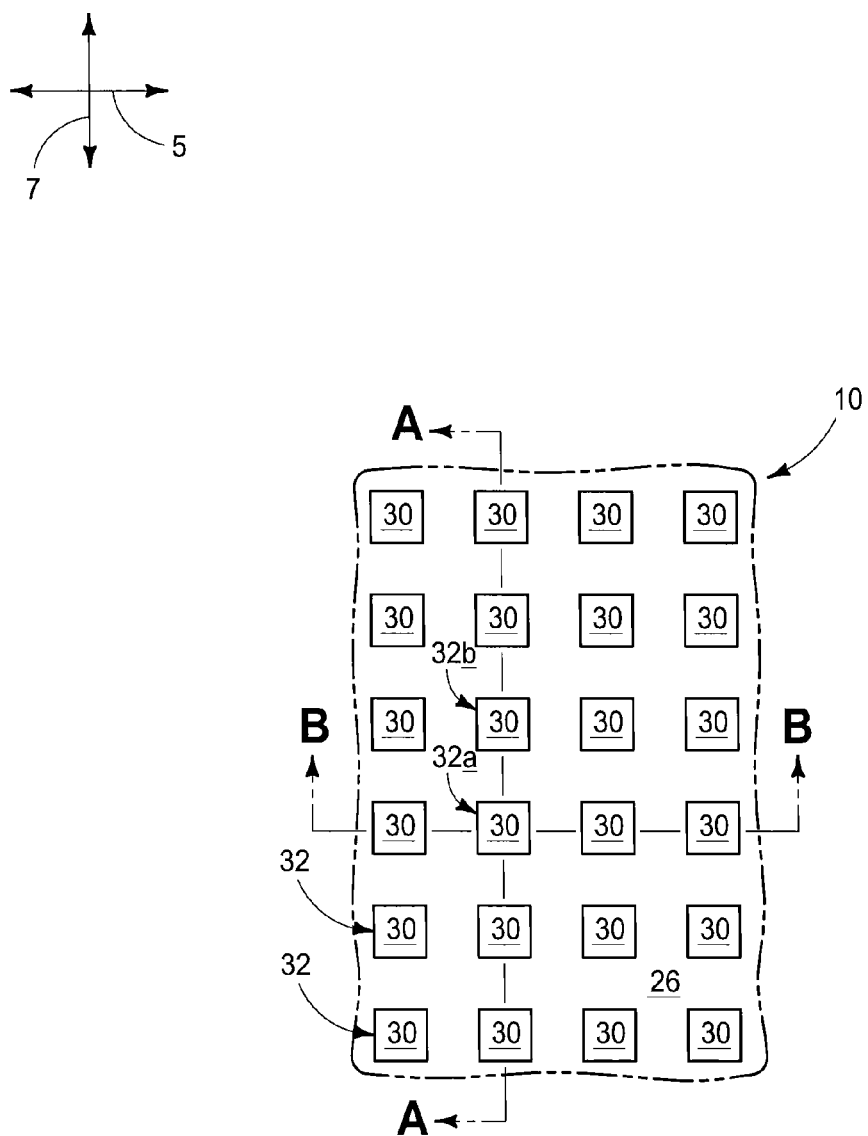
FIGS. 4-6 are a top view and cross-sectional side views of a construction at an example processing stage subsequent to that of FIGS. 1-3. The cross-sectional views of FIGS. 5 and 6 are along the lines A-A and B-B, respectively, of FIG. 4.
Figure 5:
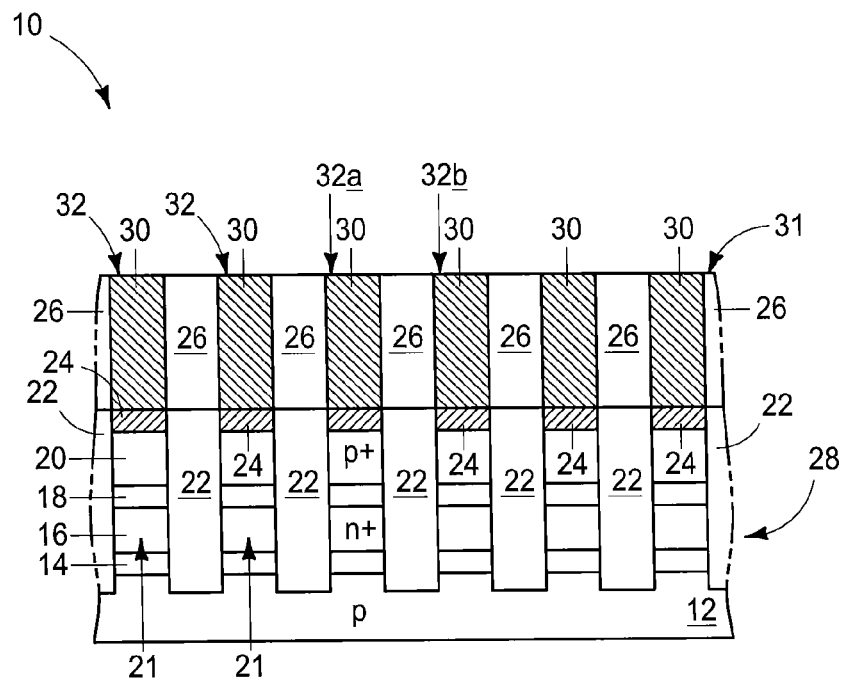
Figure 6:
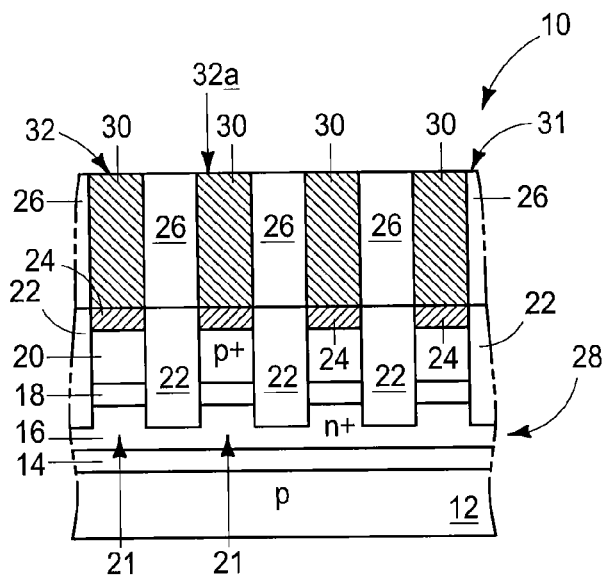

Referring to FIGS. 4-6, electrically insulative material 26 is formed across construction 10, and subsequently openings are formed through material 26 to conductive material 24 and filled with a conductive material 30.

The conductive material 30 may comprise any suitable composition or combination of compositions; and in some embodiments may comprise, consist essentially of, or consist of one or more of various metals (for example, tungsten, titanium, etc.), metal-containing compositions (for instance, metal nitride, metal carbide, metal silicide, etc.), and conductively-doped semiconductor materials (for instance, conductively-doped silicon, conductively-doped germanium, etc.). In an example embodiment, material 30 may comprise a liner of titanium nitride around a fill of tungsten.

The insulative material 26 may comprise any suitable composition or combination of compositions. In some embodiments, material 26 may comprise a same composition as material 22, and accordingly material 26 may comprise an oxygen-containing composition, such as, for example, one or more of silicon dioxide, BPSG, PSG, etc. In some embodiments material 26 may comprise a different composition than material 22; and may, for example, comprise a non-oxygen-containing composition, such as, for example, silicon nitride. Although material 26 is shown to be homogeneous, in some embodiments the material 26 may comprise multiple discrete compositions. For instance, in some embodiments a lower portion of material 26 may be an oxygen-containing composition, and an upper portion of material 26 may be a non-oxygen-containing composition as described in more detail below with reference to FIGS. 35-37.

A planarized surface 31 is shown extending across materials 30 and 26. Such surface may result from chemical-mechanical polishing (CMP). For instance, material 30 may be initially provided to overfill openings in material 26, and subsequently CMP may be utilized to remove excess material 30 and form the shown planarized surface 31.

The material 30 may be considered to form a plurality of conductive plugs, with upper regions of the conductive plugs corresponding to a plurality of spaced-apart electrical nodes 32 (only some of which are labeled) across the top of construction 10. The insulative material 26 entirely laterally surrounds the nodes 32 in the shown embodiment. In some embodiments, the nodes 32 may be considered to be supported by a semiconductor substrate comprising region 12.

The electrical nodes are arranged in the grid comprising the first direction along axis 5 and the second direction along axis 7. In the discussion that follows, one of the nodes 32 is referred to as a first node 32a, and another of the nodes is referred to as a second node 32b. The nodes 32a and 32b are substantially identical to one another, and substantially identical to all of the other nodes 32; but are called out specifically as a first node and a second node to aid in explaining some of the example embodiments.

Figure 7:
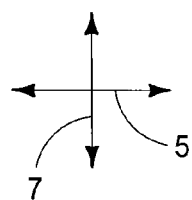
FIGS. 7-9 are a top view and cross-sectional side views of a construction at an example processing stage subsequent to that of FIGS. 4-6. The cross-sectional views of FIGS. 8 and 9 are along the lines A-A and B-B, respectively, of FIG. 7.
Figure 7:
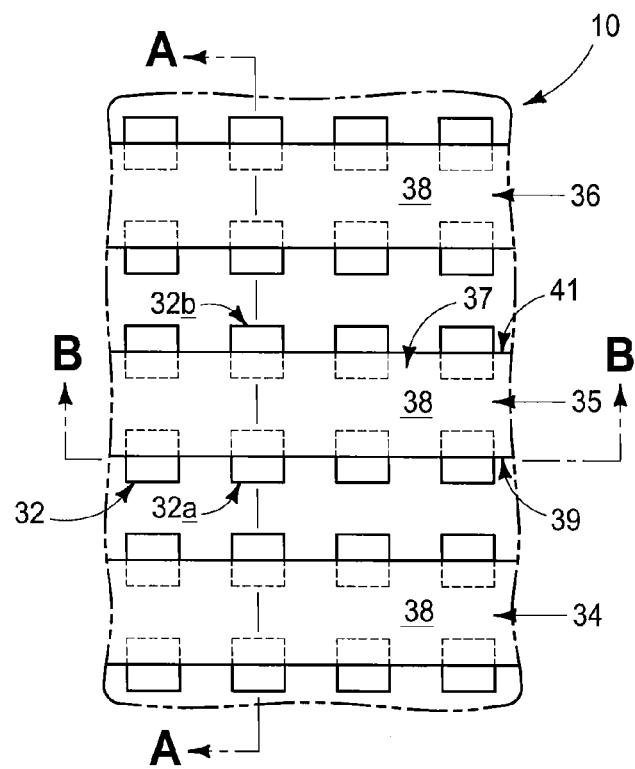
Figure 8:
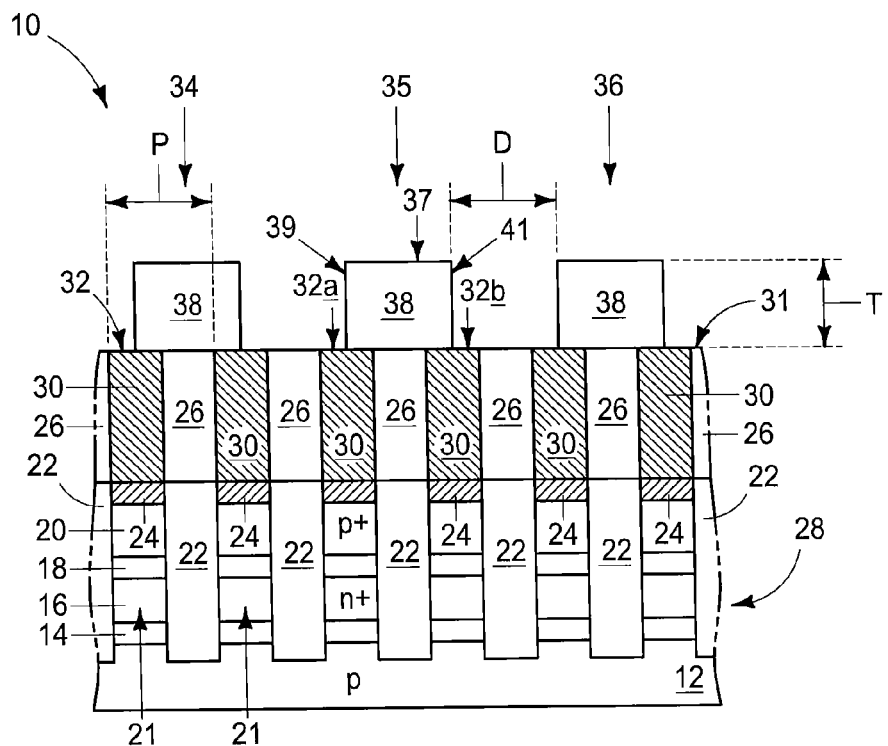
Figure 9:
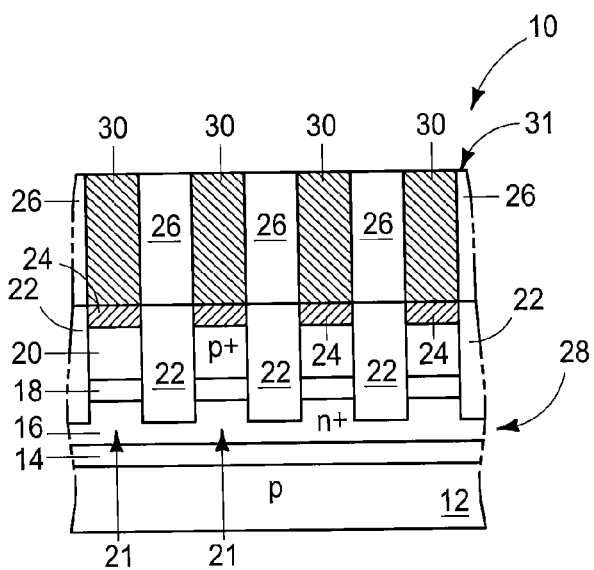

Referring to FIGS. 7-9, spaced-apart patterning structures 34-36 are formed over planarized surface 31. In the shown embodiment, the patterning structures are lines extending along the direction of axis 5 (i.e., extending along a same direction as wordlines 28). Each patterning structure comprises a top (for instance, the top 37 of structure 35) and a pair of opposing sidewalls (for instance, the sidewalls 39 and 41 of structure 35). In some embodiments, one of the sidewalls of a patterning structure may be referred to as a first sidewall and the other may be referred to as a second sidewall. Accordingly, in some embodiments sidewalls 39 and 41 may be referred to as a first sidewall and a second sidewall, respectively. The first sidewall 39 passes across and directly over one set of nodes, and the second sidewall 41 passes across and directly over a different set of nodes. In some embodiments, the nodes under the first sidewall may be referred to as a first set of nodes, and the nodes under the second sidewall may be referred to as a second set of nodes. Accordingly, node 32a may be considered to be part of a first set of nodes, and node 32b may be considered to be part of a second set of nodes.

The patterning structures span spaces between the nodes 32 and partially overlap the nodes. Portions of the nodes are shown in dashed-line in the top view of FIG. 7 to indicate that such portions are under the patterning structures 34-36.

The patterning structures comprise a material 38. Such material does not comprise oxygen, and accordingly may be referred to as a non-oxygen-containing material. In some embodiments, material 38 may comprise, consist essentially of or consist of silicon nitride.

The patterning structures 34-36 may comprise any suitable dimensions. In some embodiments, nodes 32 may be formed on a pitch P, and the patterning structures may be spaced from one another by a distance D comparable to such pitch. For instance, in some embodiments the pitch may be a dimension within a range of from about 40 nanometers to about 60 nanometers, and D may be substantially the same dimension. The patterning structures have a thickness T. In some embodiments, such thickness may be within a range of from about equal to the pitch to about three-times the pitch; and in some example embodiments may be within a range of from about 60 nanometers to about 100 nanometers.

The patterning structures may be formed with any suitable processing; including, for example, forming a layer of material 38 across planarized surface 31 followed by utilization of a patterned mask (not shown) and one or more etches to form the illustrated lines of material 38. The patterned mask may comprise any suitable mask, including, for example, a photolithographically-patterned photoresist mask and/or a mask formed utilizing pitch-modification methodologies.

Figure 10:
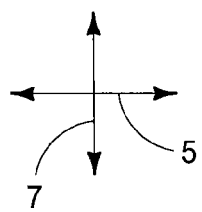
FIGS. 10-12 are a top view and cross-sectional side views of a construction at an example processing stage subsequent to that of FIGS. 7-9. The cross-sectional views of FIGS. 11 and 12 are along the lines A-A and B-B, respectively, of FIG. 10.
Figure 10:
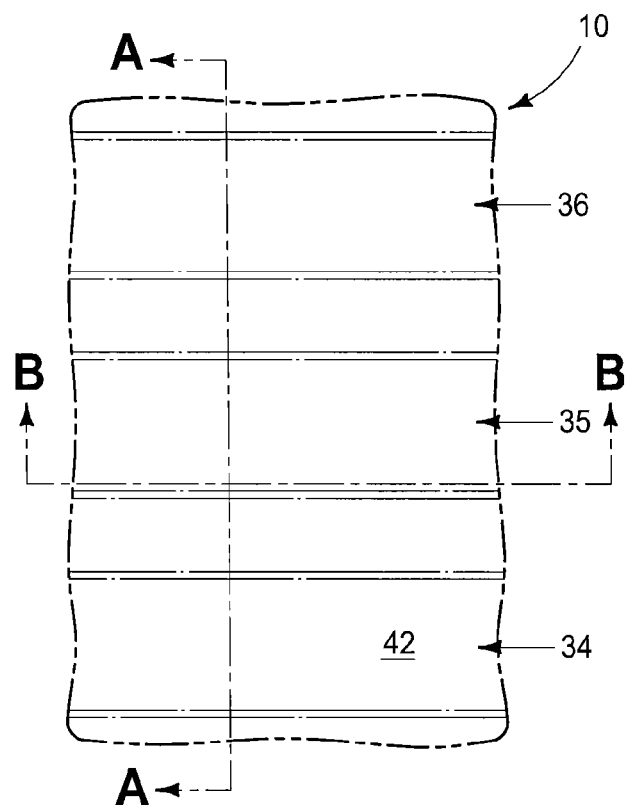
Figure 11:
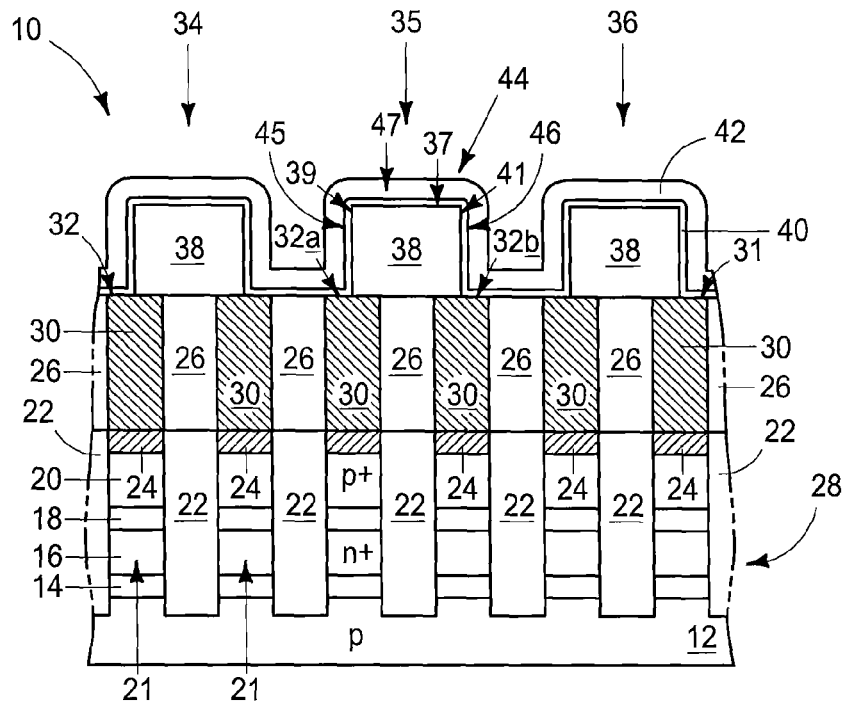
Figure 12:
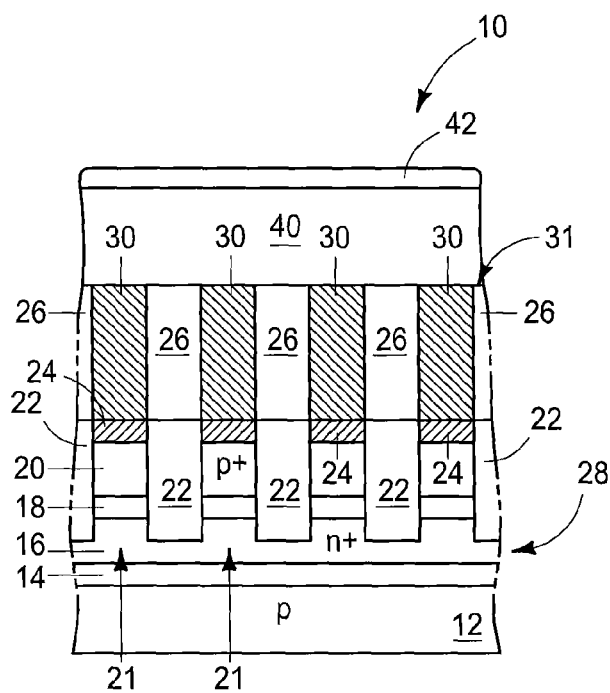

Referring to FIGS. 10-12, phase change material 40 is formed across the patterning structures 34-36 and within gaps between the patterning structures. The phase change material may comprise, consist essentially of, or consist of a chalcogenide; such as, for example, a mixture of germanium, antimony and tellurium (i.e., a mixture commonly referred to as GST). The phase change material is an example of an oxygen-sensitive material; with the term "oxygen-sensitive material" meaning a material which is altered in a non-desired manner upon exposure to oxygen. In some embodiments, processing described herein provides non-oxygen-containing materials directly against an oxygen-sensitive material to protect the oxygen-sensitive material from exposure to oxygen. Such may alleviate or prevent degradation of the oxygen-sensitive material (which may be referred to as oxygen poisoning) that could problematically occur in processing lacking such protective material. Although the example oxygen-sensitive material described herein is phase change material, in other embodiments analogous processing to that described herein may be utilized for other oxygen-sensitive materials.

The material 40 is shown to extend along the exterior surfaces of patterning structures 34-36, and specifically extends along the sidewall surfaces and top surfaces of such patterning structures (for instance, surfaces 37, 39 and 41 of structure 35). In some embodiments, the material 40 may be considered to be configured as bridges which extend from upper surfaces of first nodes to upper surfaces of second nodes. For instance, an example bridge 44 is shown to extend from the upper surface of first node 32a to the upper surface of second node 32b; with such bridge extending across patterning structure 35. The bridge may be considered to have a first segment 45 along the first sidewall 39 of the patterning structure, a second segment 46 along the second sidewall 41 of the patterning structure, and a third segment 47 across the top of the patterning structure.

The material 40 may have any suitable thickness, and in some embodiments may have a thickness within a range of from about 5 nanometers to about 10 nanometers. The material 40 may be formed with any suitable processing; including, for example, one or more of atomic layer deposition (ALD), chemical vapor deposition (CVD) and physical vapor deposition (PVD). In some embodiments, material 40 may be referred to as a sheet or film formed across the patterning structures 34-36, and across the spaces between such patterning structures.

Non-oxygen-containing material 42 is formed over and directly against the oxygen-sensitive material 40. The non-oxygen-containing material may comprise a same composition as the non-oxygen-containing material 38 of patterning structures 34-36, or may comprise a different composition relative to material 38. In some embodiments, both of materials 38 and 42 may comprise, consist essentially of, or consist of silicon nitride. The materials 38 and 42 may be referred to as a first non-oxygen-containing material and a second non-oxygen-containing material, respectively, in some embodiments.

The material 42 may be formed with any suitable processing, including, for example one or more of ALD, CVD and PVD.

Figure 13:
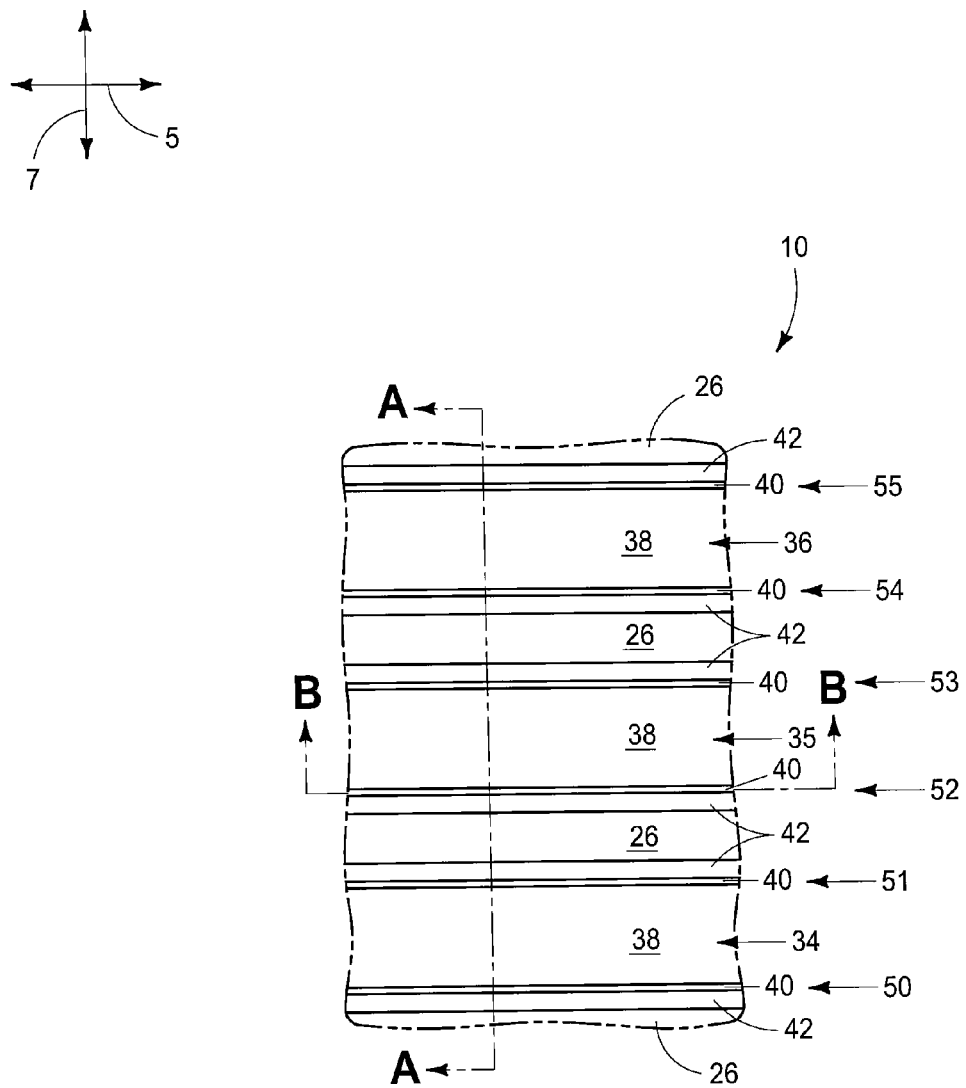
FIGS. 13-15 are a top view and cross-sectional side views of a construction at an example processing stage subsequent to that of FIGS. 10-12. The cross-sectional views of FIGS. 14 and 15 are along the lines A-A and B-B, respectively, of FIG. 13.
Figure 14:
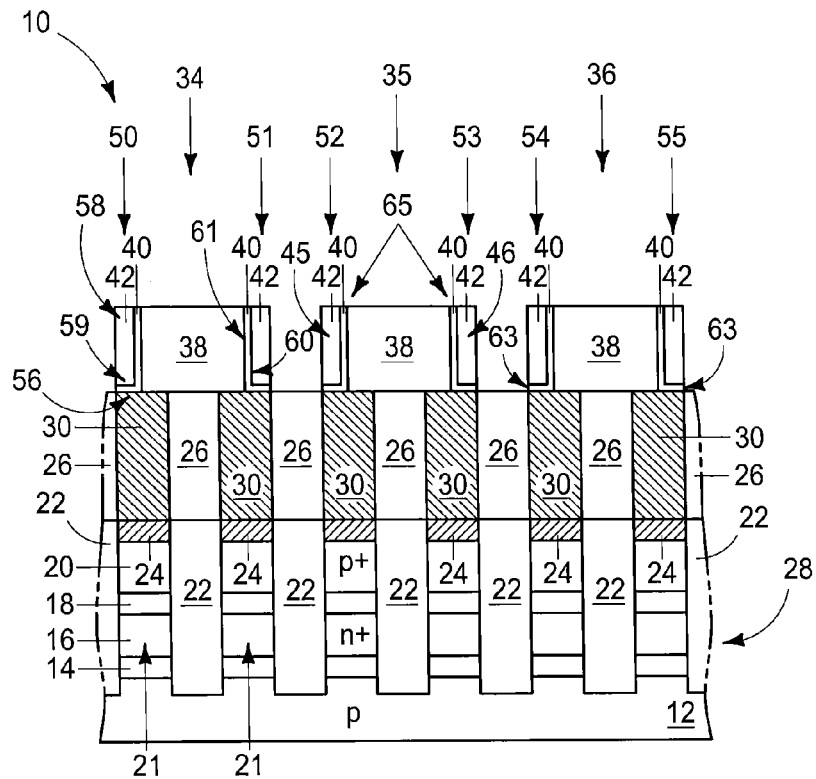
Figure 15:
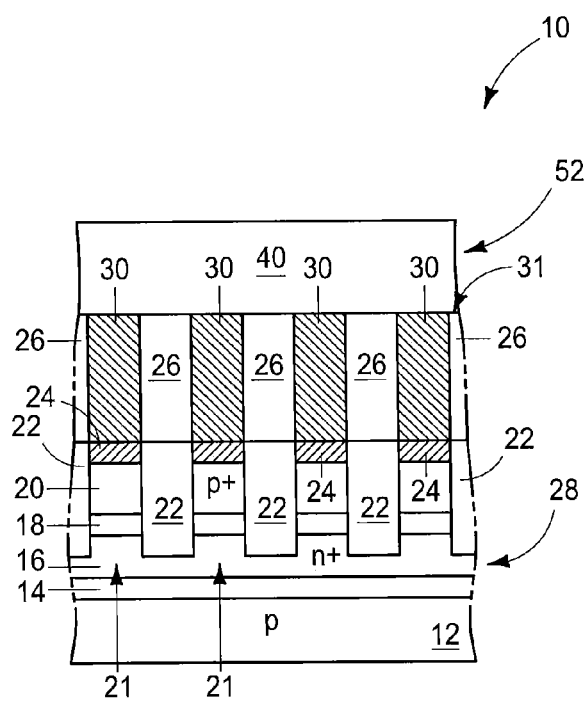

Referring to FIGS. 13-15, the materials 40 and 42 are exposed to anisotropic etching which removes the materials from over upper surfaces of patterning structures 34-36, and from regions between the patterning structures, while leaving the materials 40 and 42 along sidewalls of the patterning structures. In some embodiments, the processing of FIGS. 13-15 may be considered to remove at least some of the third segment 47 (FIG. 11) of the bridge 44 (FIG. 11) defined by oxygen-sensitive material 40 to separate the first and second segments 45 and 46 from one another. All of such third segment has been removed in the shown embodiment, but in other embodiments (not shown) only some of the third segment may be removed. The segments 45 and 46 have exposed upper regions 65 at the processing stage of FIGS. 13-15.

The oxygen-sensitive material 40 remaining at the processing stage of FIGS. 13-15 is in the form of lines 50-55 extending along the sidewalls of patterning structures 34-36. Each line is configured as an angled-plate having a horizontal portion 56 (one of which is labeled in FIG. 14) and a non-horizontal portion 58 (one of which is labeled in FIG. 14). The horizontal portion is over and directly against an underlying node 32, and the non-horizontal portion extends upwardly from the horizontal portion at a corner 59 (one of which is labeled in FIG. 14). In the shown embodiment, the non-horizontal portions are substantially orthogonal to the horizontal portions, and accordingly the corners are about 90°. In other embodiments, the corners may have other angles.

In some embodiments, corners 59 may be referred to as inside corners, and angled plates 50-55 may be considered to comprise interior sidewalls 60 (only one of which is labeled in FIG. 14) along the inside corners, and to comprise exterior sidewalls 61 (only one of which is labeled in FIG. 14) in opposing relation to the interior sidewalls.

The horizontal portions 56 of plates 50-55 have exposed lateral edges 63 (only some of which are labeled) at the processing stage of FIGS. 13-15.

Figure 16:
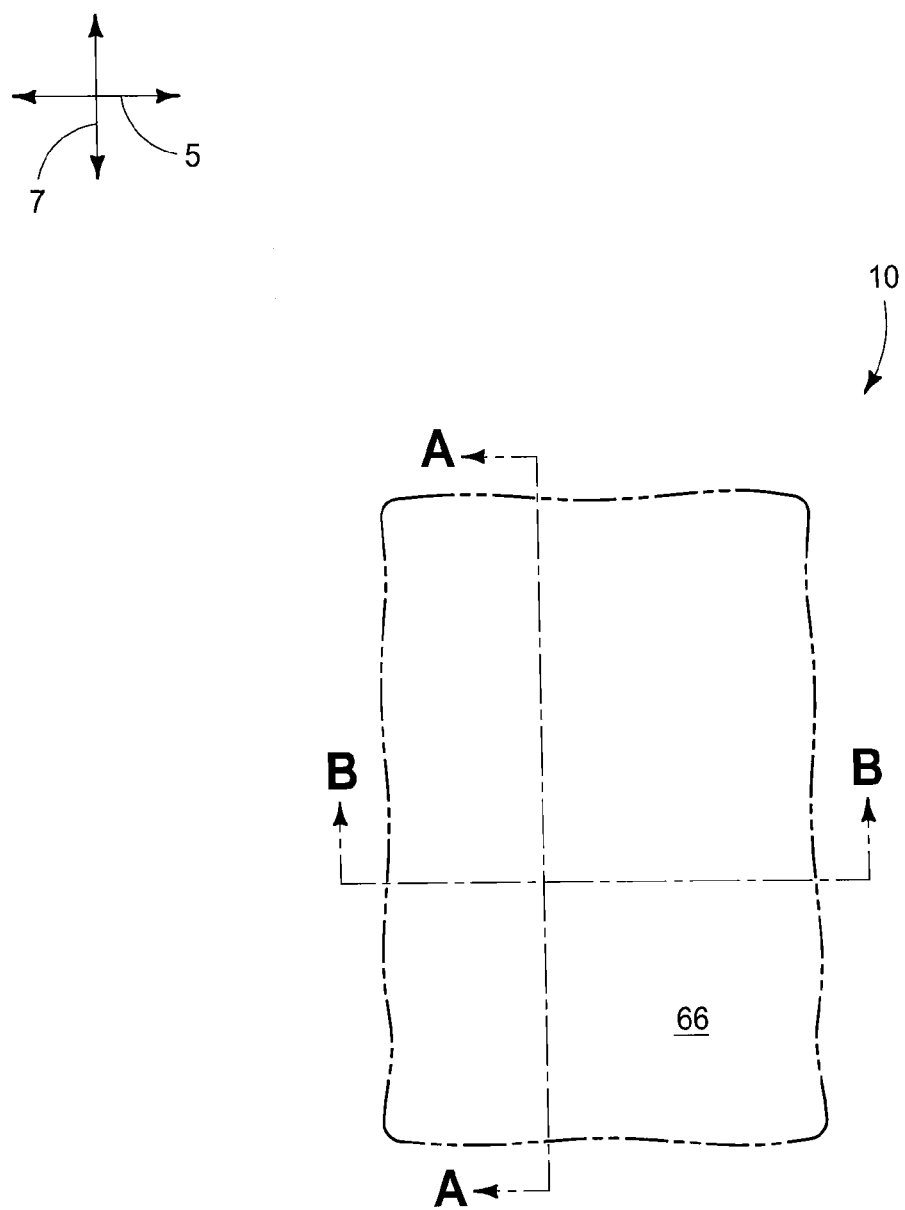
FIGS. 16-18 are a top view and cross-sectional side views of a construction at an example processing stage subsequent to that of FIGS. 13-15. The cross-sectional views of FIGS. 17 and 18 are along the lines A-A and B-B, respectively, of FIG. 16.
Figure 17:
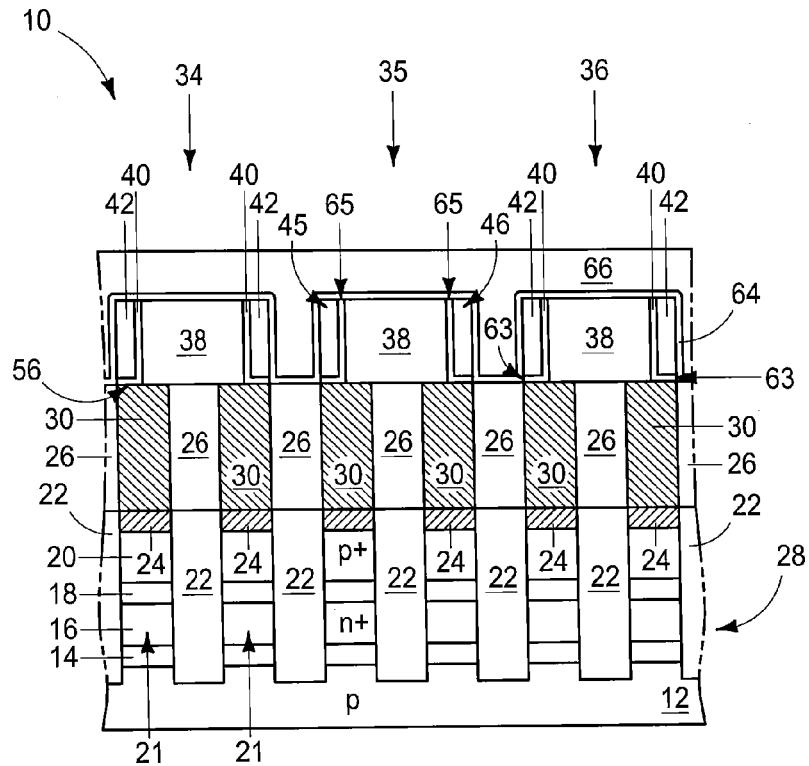
Figure 18:
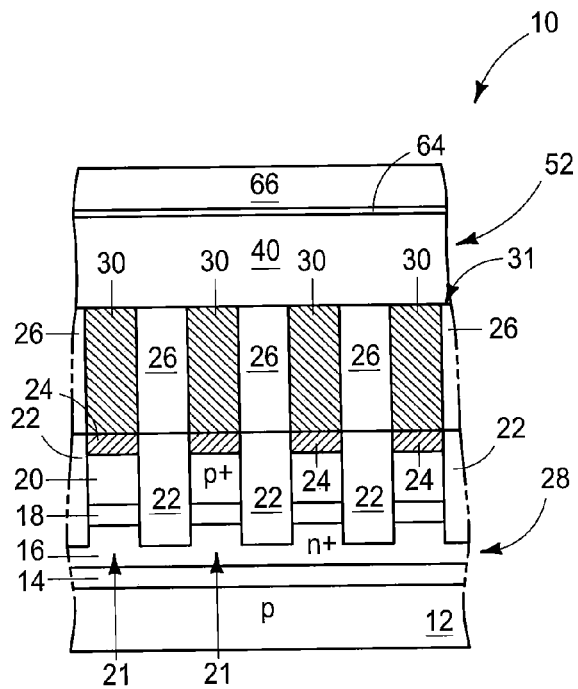

Referring to FIGS. 16-18, a third non-oxygen-containing material 64 is formed across the oxygen-sensitive material 40. The material 64 covers the exposed material 40 along the upper regions 65 of the segments 45 and 46. The material 64 also covers the exposed material 40 along the lateral edges 63 of the horizontal projections 56.

Material 64 may comprise any suitable composition or combination of compositions. In some embodiments, non-oxygen-containing material 64 may comprise a same composition as one or both of the first and second non-oxygen-containing materials 38 and 42; and in some embodiments material 64 may comprise a different composition than one or both of materials 38 and 42. In some embodiments, material 64 may comprise, consist essentially of, or consist of silicon nitride.

Material 64 may be formed with any suitable processing, including, for example, one or more of ALD, CVD and PVD. In some embodiments, the material 64 may have a thickness within a range of from about 5 nanometers to about 10 nanometers.

A dielectric material 66 is formed over material 64 and across the patterning structures 34-36. The material 66 may comprise any suitable composition or combination of compositions; and in some embodiments may comprise oxygen. For instance, material 66 may comprise one or more of silicon dioxide, BPSG, PSG, aluminum oxide, etc. The dielectric material 66 may be formed with any suitable processing, including, for example, one or more of ALD, CVD and PVD.

Figure 19:
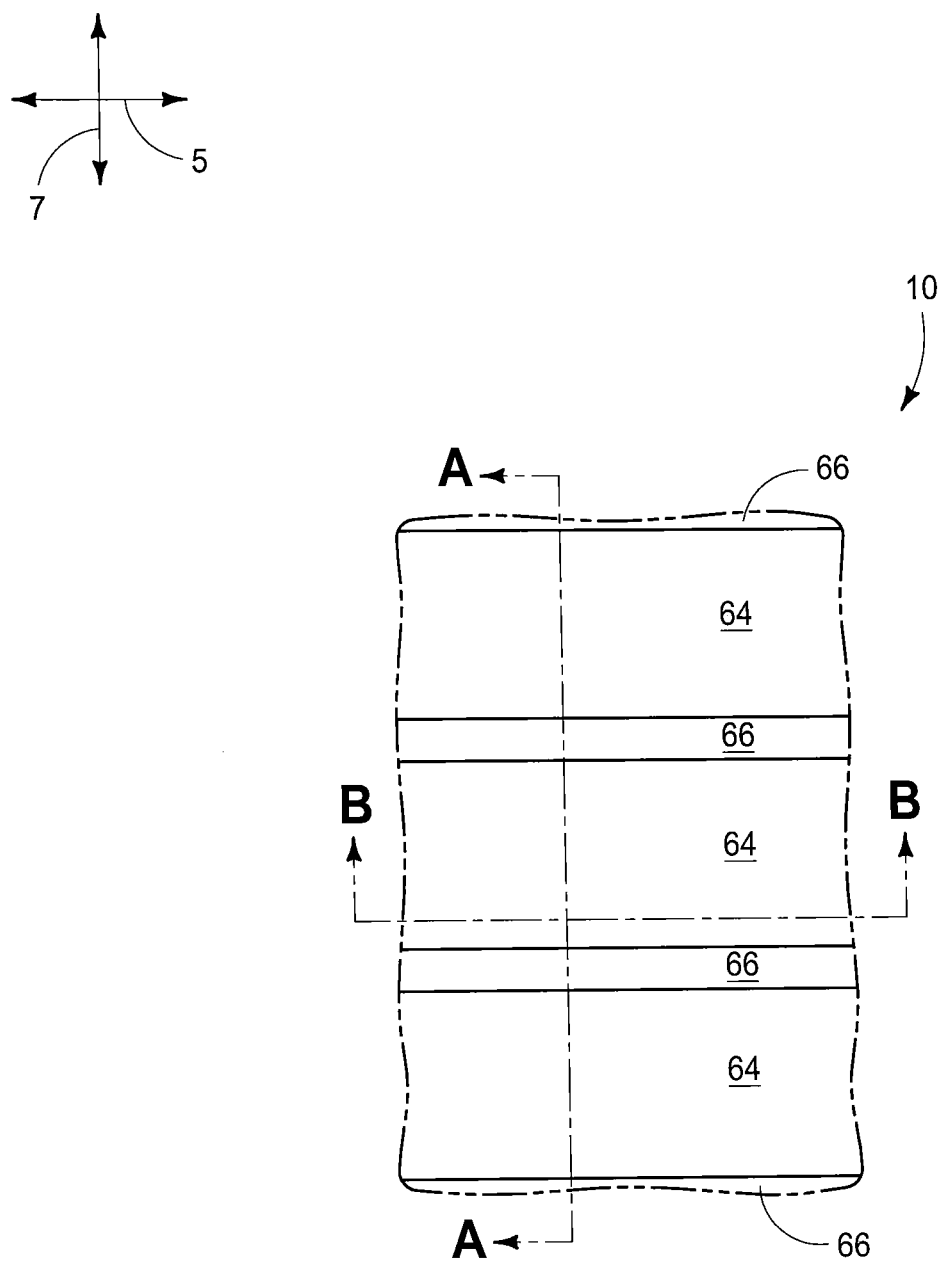
FIGS. 19-21 are a top view and cross-sectional side views of a construction at an example processing stage subsequent to that of FIGS. 16-18. The cross-sectional views of FIGS. 20 and 21 are along the lines A-A and B-B, respectively, of FIG. 19.
Figure 20:
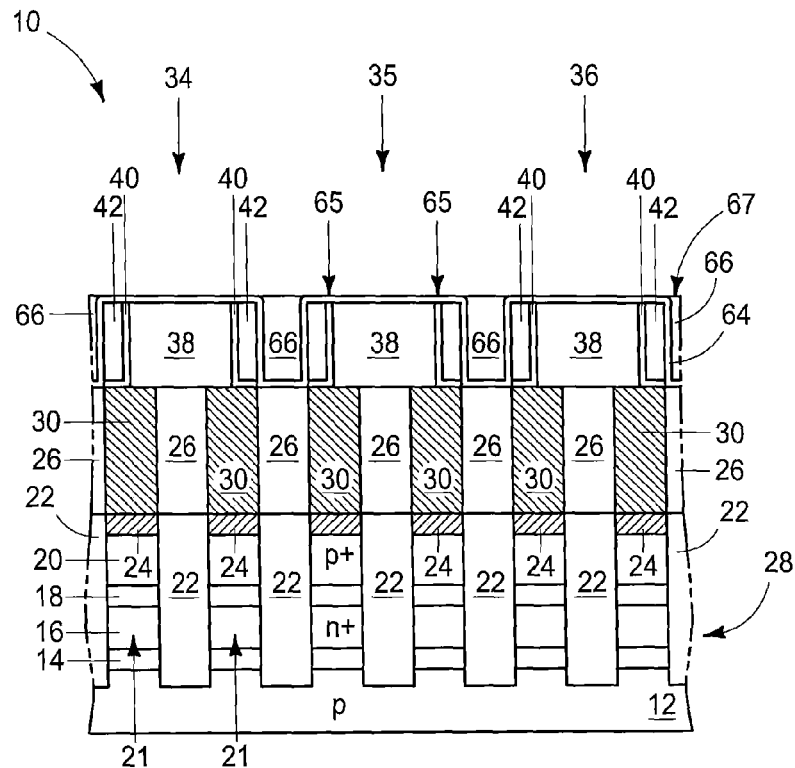
Figure 21:
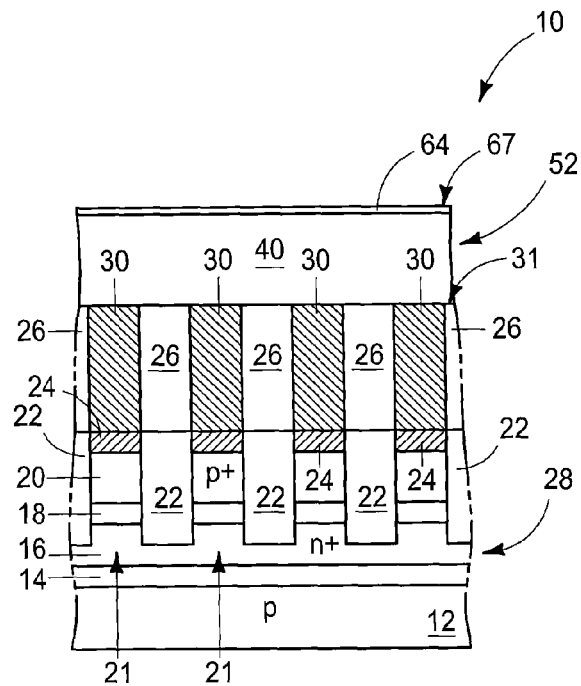

Referring to FIGS. 19-21, CMP or other suitable planarization is utilized to remove material 66 from over material 64 and form the shown planarized surface 67.

Figure 22:
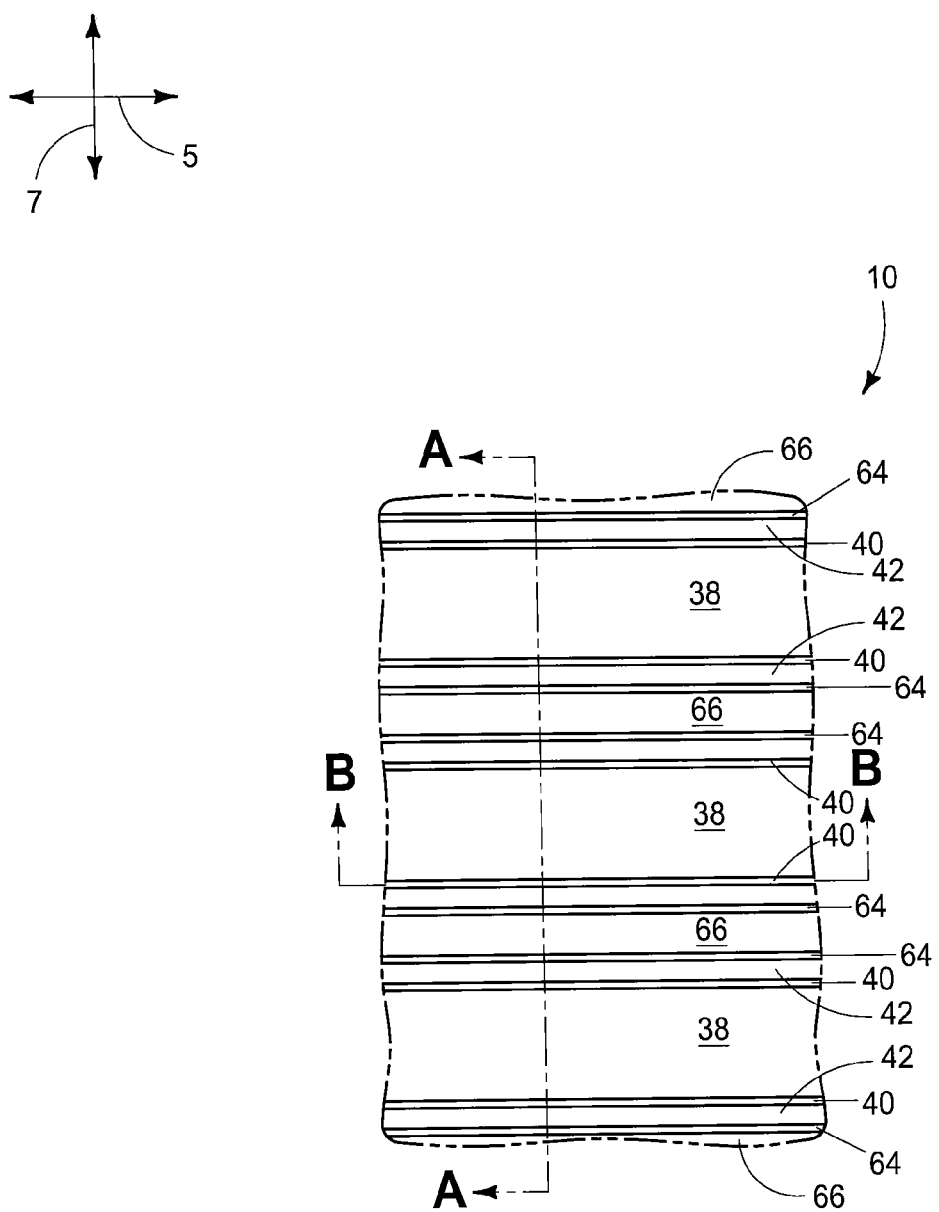
FIGS. 22-24 are a top view and cross-sectional side views of a construction at an example processing stage subsequent to that of FIGS. 19-21. The cross-sectional views of FIGS. 23 and 24 are along the lines A-A and B-B, respectively, of FIG. 22.
Figure 23:
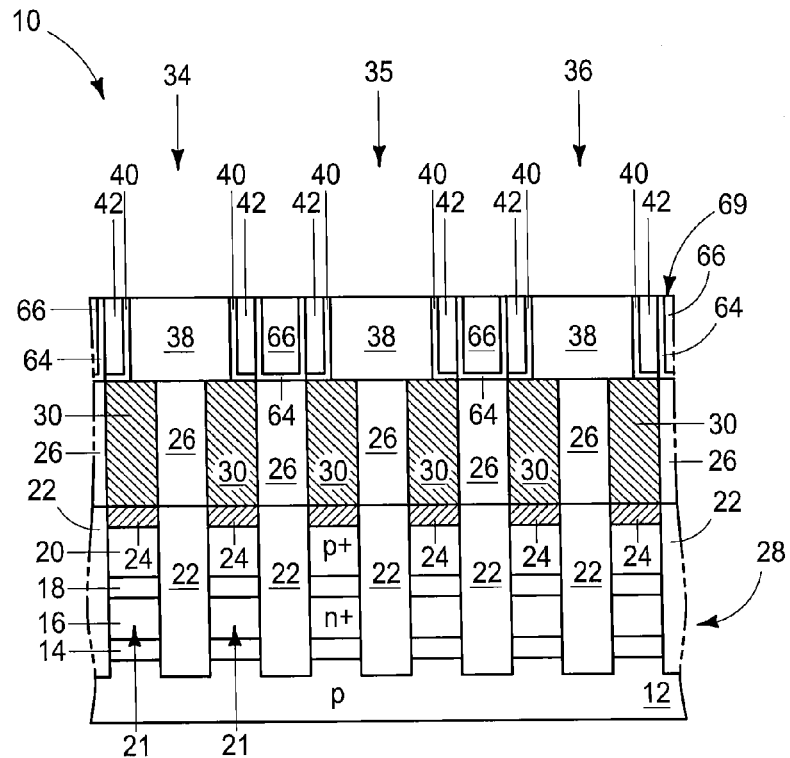
Figure 24:
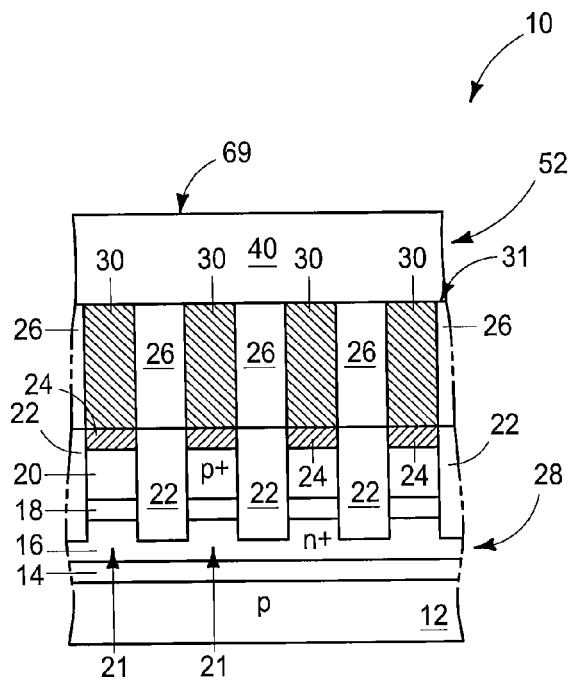

Referring to FIGS. 22-24, CMP or other suitable planarization is utilized to form the shown planarized surface 69. In some embodiments, the planarization may be considered to expose the upper regions 65 (FIG. 14) of the segments 45 and 46 (FIG. 14).

Figure 25:
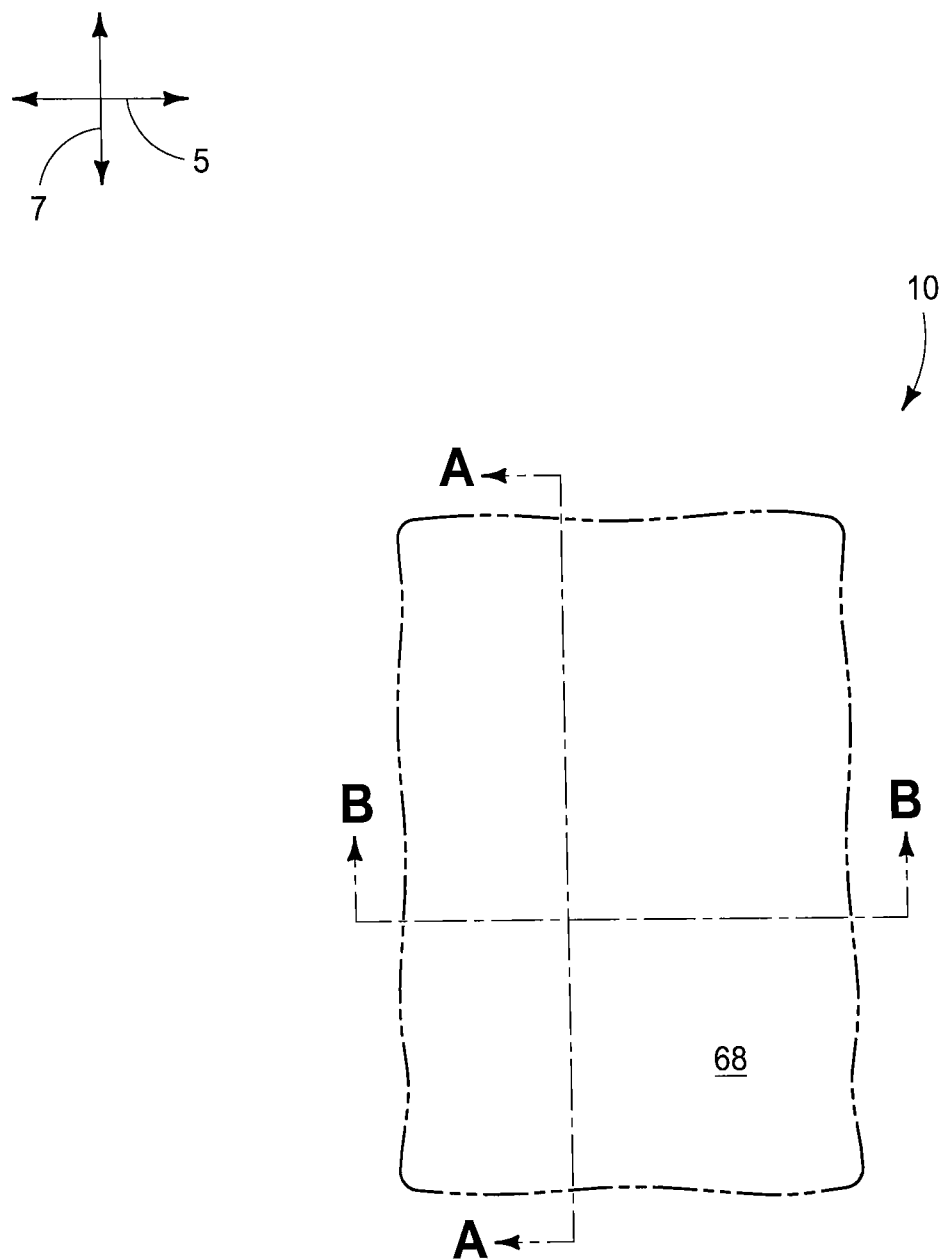
FIGS. 25-27 are a top view and cross-sectional side views of a construction at an example processing stage subsequent to that of FIGS. 22-24. The cross-sectional views of FIGS. 26 and 27 are along the lines A-A and B-B, respectively, of FIG. 25.
Figure 26:
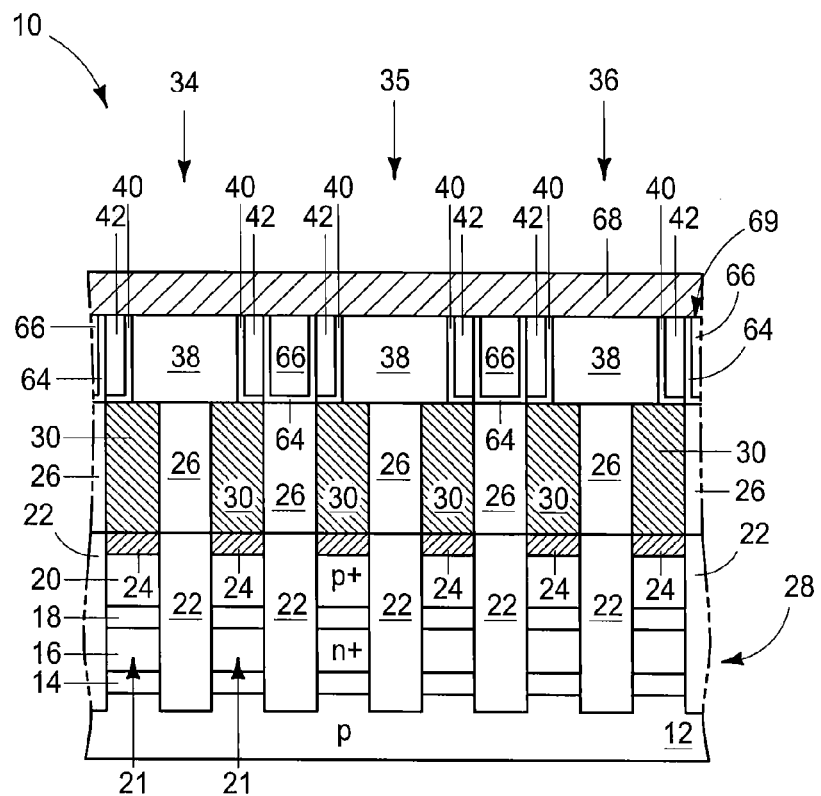
Figure 27:
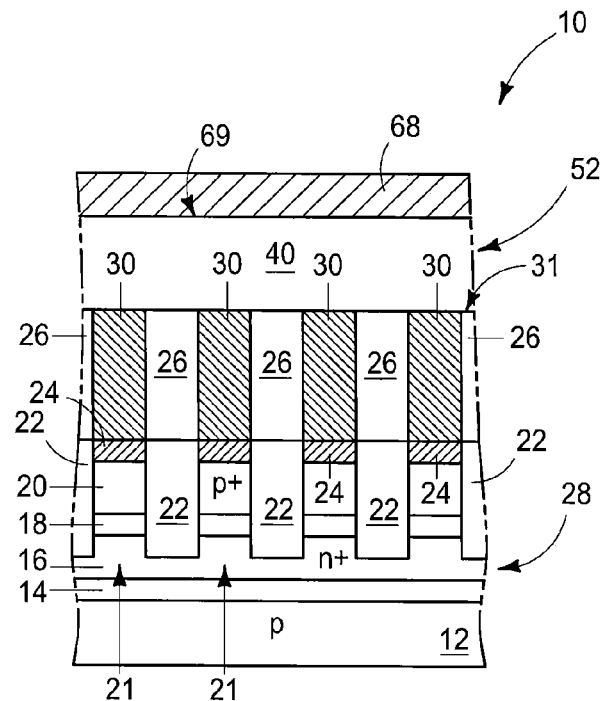

Referring to FIGS. 25-27, electrically conductive material 68 is formed across planarized surface 69. The material 68 may be utilized to form bitlines, and accordingly may be referred to as bitline material in some embodiments. The material 68 may comprise any suitable composition or combination of compositions; including, for example, one or more of various metals, metal-containing compositions and conductively-doped semiconductor materials. In some embodiments, material 68 may comprise tungsten over titanium nitride.

Figure 28:
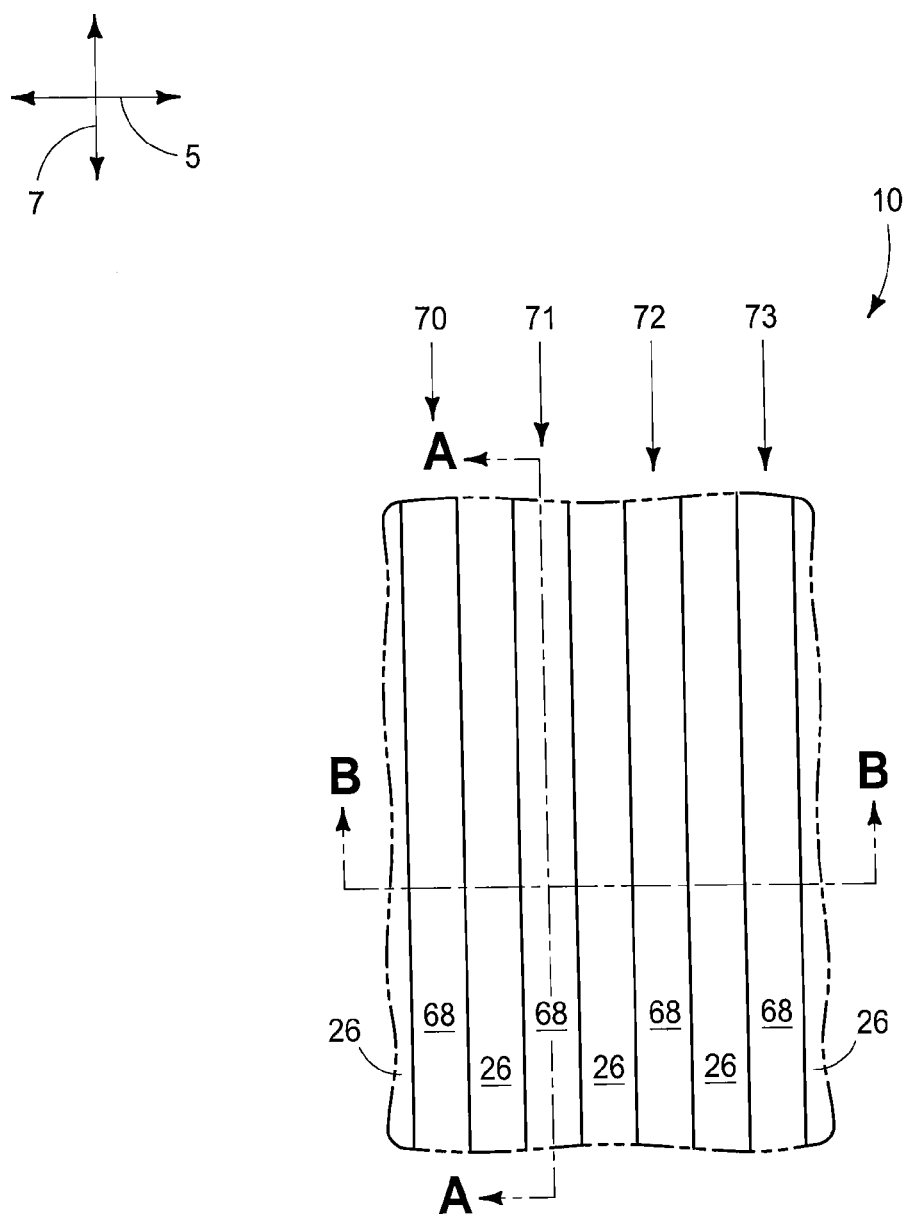
FIGS. 28-30 are a top view and cross-sectional side views of a construction at an example processing stage subsequent to that of FIGS. 25-27. The cross-sectional views of FIGS. 29 and 30 are along the lines A-A and B-B, respectively, of FIG. 28.
Figure 29:
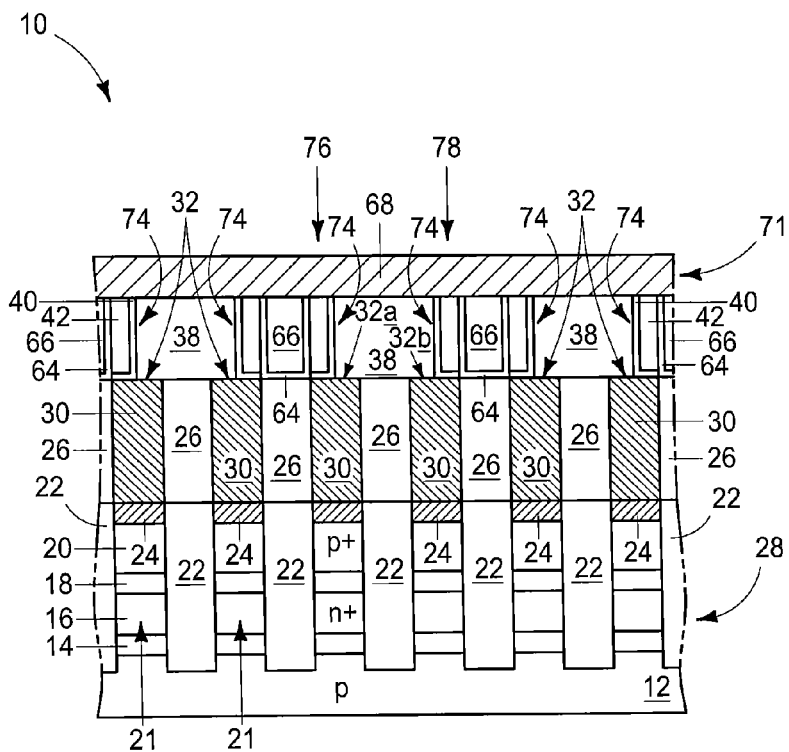
Figure 30:
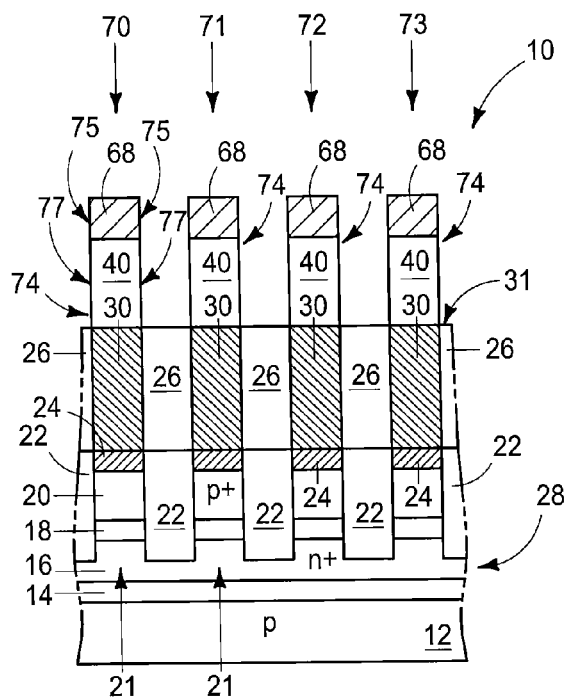

Referring to FIGS. 28-30, material 68 is patterned into a plurality of bitlines 70-73 which extend along the direction of axis 7 (i.e., which are substantially orthogonal to the direction of the wordline 28). The pattern of the bitlines is also transferred into materials 38, 40, 42, 64 and 66. Such etches the lines 50-55 (FIGS. 13-15) of oxygen-sensitive material 40 into structures 74 that are in one-to-one correspondence with nodes 32. The material 68 may be patterned into bitlines utilizing any suitable processing; including, for example, utilizing a patterned mask (not shown) to define a desired pattern of the bitlines, and transferring such pattern into the bitline material with one or more suitable etches.

FIG. 30 shows that the bitlines 70-73 have sidewalls 75 (only some of which are labeled) which extend upwardly from lateral edges 77 (only some of which are labeled) of the structures 74.

Each of the structures 74 may be incorporated into a separate memory cell. For instance, in some embodiments material 40 is phase change material, and accordingly structures 74 are phase change material structures (for instance, chalcogenide structures). The phase change material structure directly between a bitline and an underlying node may become the programmable material of a memory cell. In the shown embodiment, the phase change material is utilized without a heating element (i.e., is utilized in a self-heating memory cell). In other embodiments, processing analogous to that described herein may be utilized to form phase change memory which incorporates heating elements into the memory cells.

The segments 45 and 46 of material 40 that are described above with reference to FIG. 14 ultimately become incorporated into a pair of adjacent memory cells under the bitline 71, with such memory cells being diagrammatically indicated by the labels 76 and 78.

Figure 31:
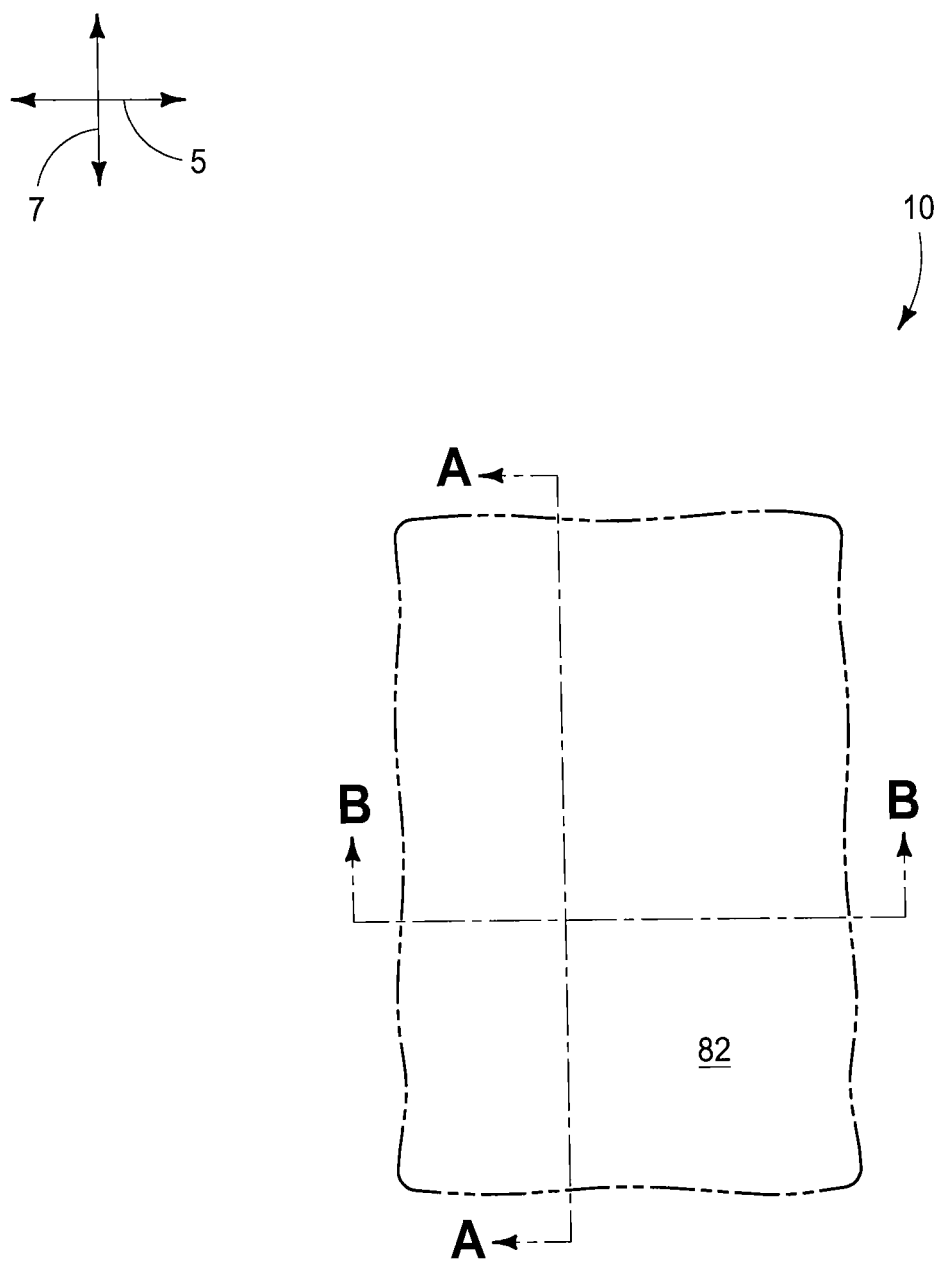
FIGS. 31-33 are a top view and cross-sectional side views of a construction at an example processing stage subsequent to that of FIGS. 28-30. The cross-sectional views of FIGS. 32 and 33 are along the lines A-A and B-B, respectively, of FIG. 31.
Figure 32:
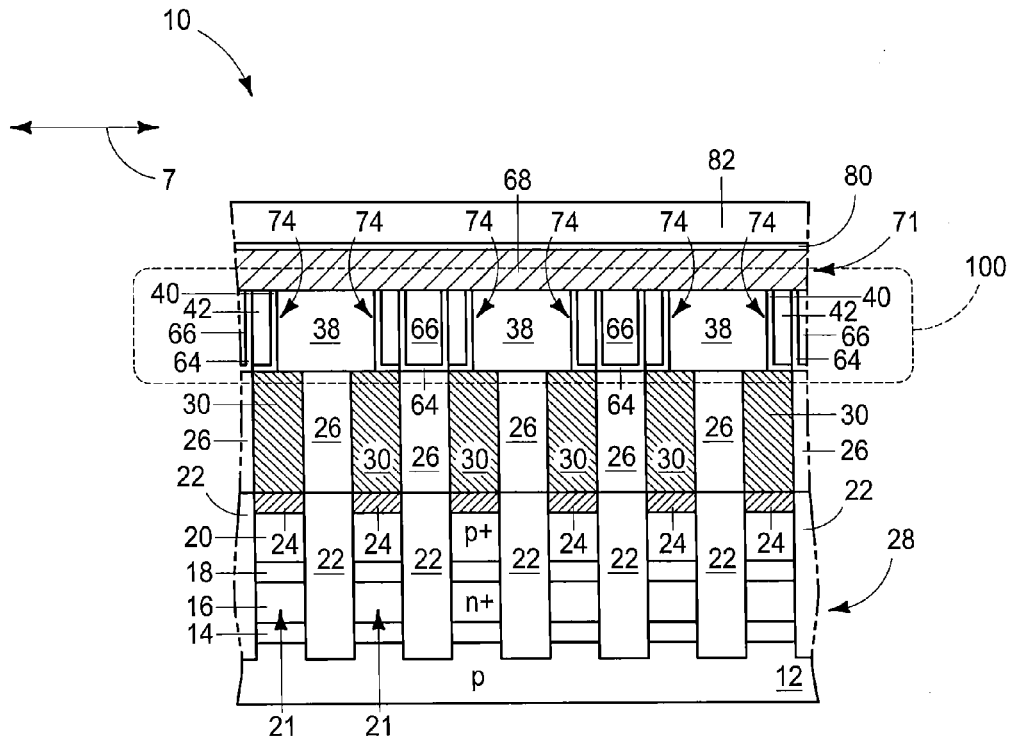
Figure 33:
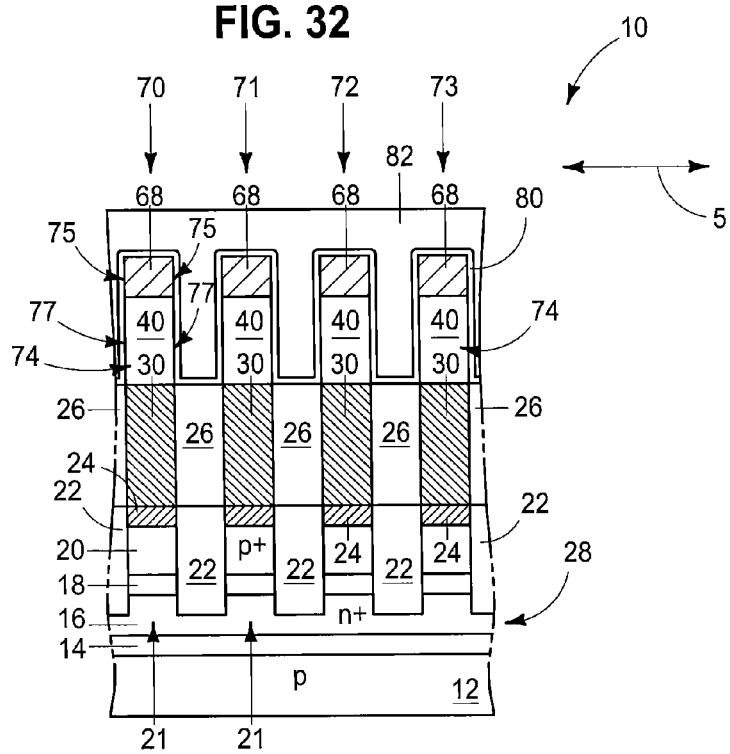

Referring to FIGS. 31-33, a fourth non-oxygen-containing material 80 is formed over and between bitlines 70-73. The material 80 is directly against the phase change material structures 74, as shown in FIG. 33.

Material 80 may comprise any suitable composition or combination of compositions. In some embodiments, non-oxygen-containing material 80 may comprise a same composition as one or more of the first, second and third non-oxygen-containing materials 38, 42 and 64; and in some embodiments material 80 may comprise a different composition than one or more of materials 38, 42 and 64. In some embodiments, material 80 may comprise, consist essentially of or consist of silicon nitride.

Material 80 may be formed with any suitable processing, including, for example, one or more of ALD, CVD and PVD. In some embodiments, the material 80 may have a thickness within a range of from about 5 nanometers to about 10 nanometers.

A dielectric material 82 is formed over material 80. The dielectric material 82 may comprise any suitable composition or combination of compositions, and in some embodiments may be an oxygen-containing material. For instance, in some embodiments material 82 may comprise one or more of silicon dioxide, BPSG, PSG, aluminum oxide, etc.

Figure 34:
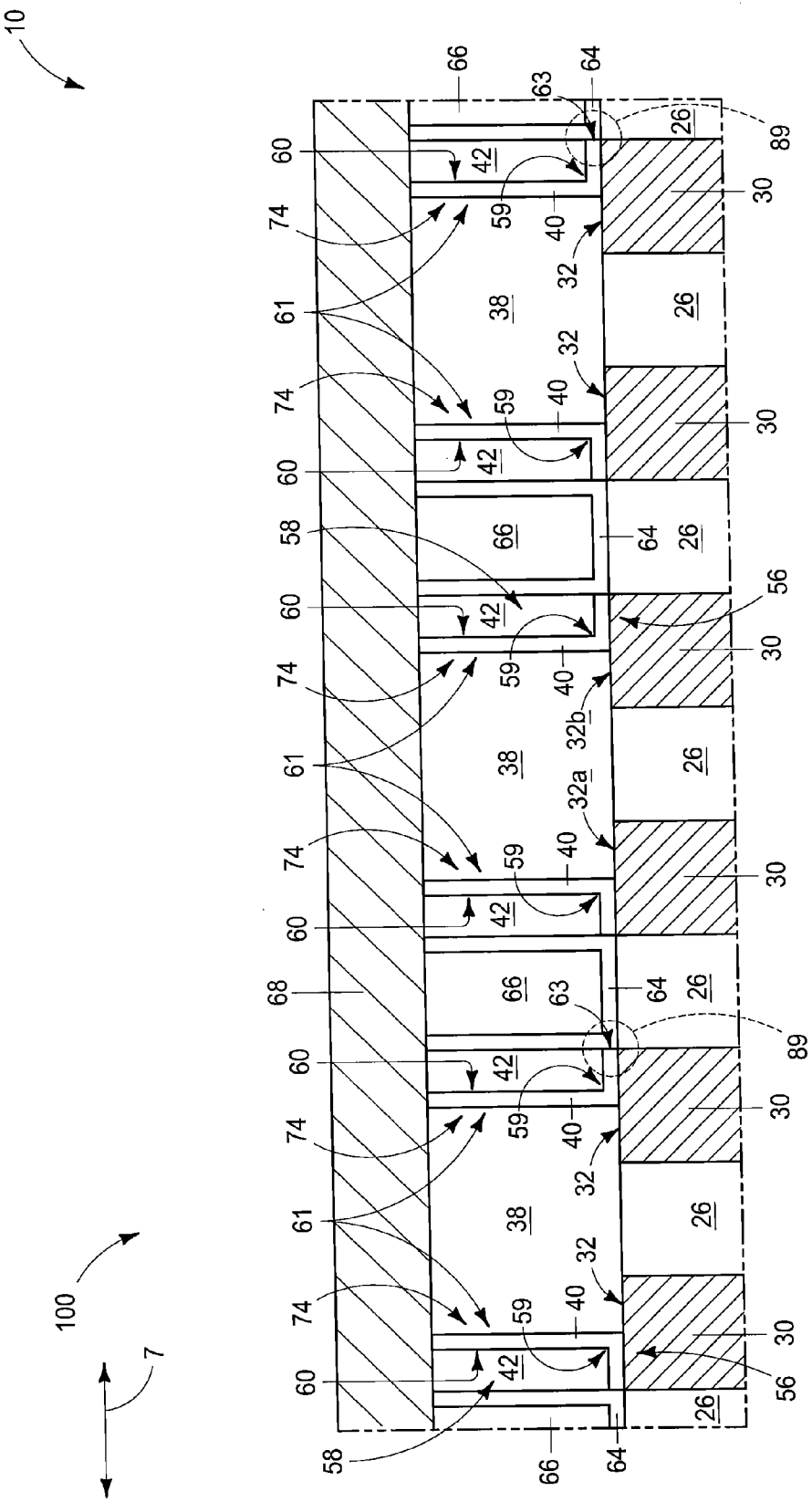
FIG. 34 is an enlarged view of a region of FIG. 32.

The construction of FIGS. 31-33 advantageously has a non-oxygen-containing protective material surrounding oxygen-sensitive material 40. Such construction is an example of an improved architecture that may be formed utilizing the processing described above. FIG. 34 shows an enlarged view of a region 100 of FIG. 32.

The enlarged view of FIG. 34 shows that the phase change material 40 (or other oxygen-sensitive material in other embodiments) is configured as structures 74 that are directly against the underlying nodes 32. Each of the structures 74 is configured as an angled plate having a horizontal portion 56 (only some of which are labeled) joining to a non-horizontal portion 58 (only some of which are labeled) at a corner 59 (only some of which are labeled). Each angled plate structure 74 comprises an interior sidewall 60 and an exterior sidewall 61 (the terms "exterior sidewall" and "interior sidewall" were described above with reference to FIGS. 13-15). The interior and exterior sidewalls are connected to one another through the lateral edges 77 shown FIG. 33.

The horizontal portions 56 of FIG. 34 project along a first direction corresponding to the direction of axis 7 of FIG. 31, and such axis is provided in FIGS. 32 and 34 to assist the reader in understanding some embodiments described herein. The phase change structures 74 are arranged along the first direction of axis 7 in a repeating pattern of interior sidewall/ interior sidewall/exterior sidewall/exterior sidewall in the embodiment of FIG. 34. Adjacent interior sidewalls 60 are spaced from one another by materials 42, 64 and 66. Adjacent exterior sidewalls 61 are spaced from one another only by material 38.

FIG. 34 shows the construction 10 along the direction of axis 7. FIG. 33 shows the construction along the direction of the axis 5, which is orthogonal to axis 7. FIG. 33 shows that adjacent phase change material structures 74 are oriented edge-to-edge along axis 5 in the shown embodiment; and are spaced from one another by gaps containing materials 80 and 82.

The non-oxygen-containing materials 38, 42 and 64 may be together considered to form a non-oxygen-containing structure which is along the interior sidewalls 60 and exterior sidewalls 61 of the phase change material structures 74. Further, the non-oxygen-containing material 80 of FIGS. 31-33 may be considered to be part of such non-oxygen-containing structure. In some embodiments, two or more of the non-oxygen-containing materials may be different from one another, and in such embodiments the non-oxygen-containing structure may be considered to be a laminate of two or more different compositions. In other embodiments, all of the non-oxygen-containing materials may be a common composition, and accordingly the non-oxygen-containing structure may be a single composition. For instance, the non-oxygen-containing structure may comprise, consist essentially of, or consist of silicon nitride.

The non-oxygen-containing materials 38, 42, 64 and 80 protect oxygen-sensitive material 40 from exposure to oxygen, which can alleviate or prevent oxygen-induced degradation of such material. In some embodiments, utilization of non-oxygen-containing materials directly against the various surfaces of oxygen-sensitive material 40 can preclude oxygen-induced degradation of the oxygen-sensitive material when oxygen-containing dielectric materials are utilized proximate the oxygen-sensitive material. Oxygen-containing dielectric materials may be relatively cheap as compared to other dielectric materials. Some embodiments advantageously provide structures and methods which enable utilization of oxygen-containing dielectric materials, while precluding oxygen-induced degradation of oxygen-sensitive materials.

Figure 35:
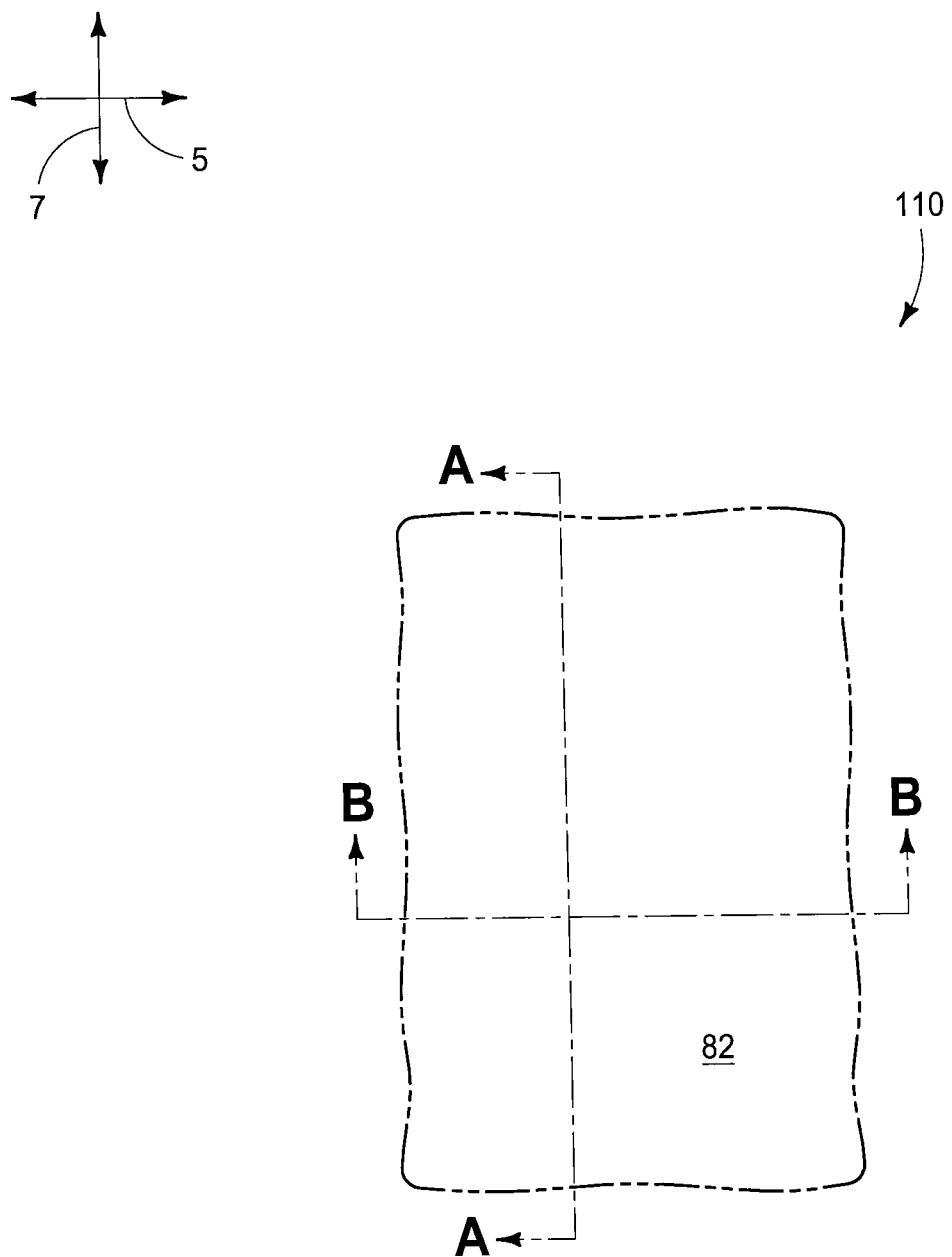
FIGS. 35-37 are a top view and cross-sectional side views of a construction at an example processing stage analogous to that of FIGS. 31-33 in accordance with another example embodiment. The cross-sectional views of FIGS. 36 and 37 are along the lines A-A and B-B, respectively, of FIG. 35.
Figure 36:
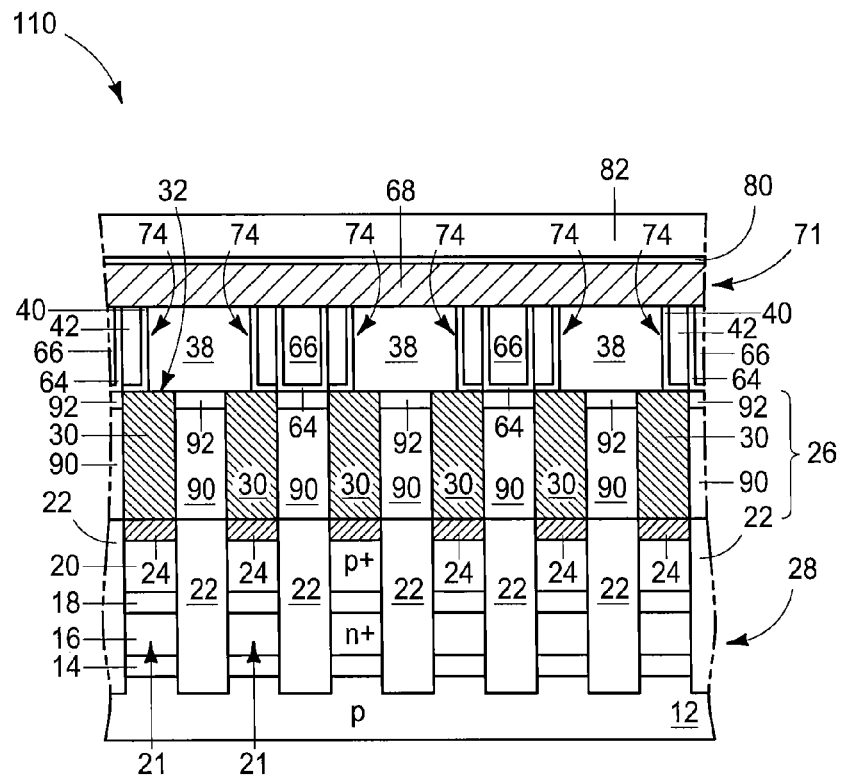
Figure 37:
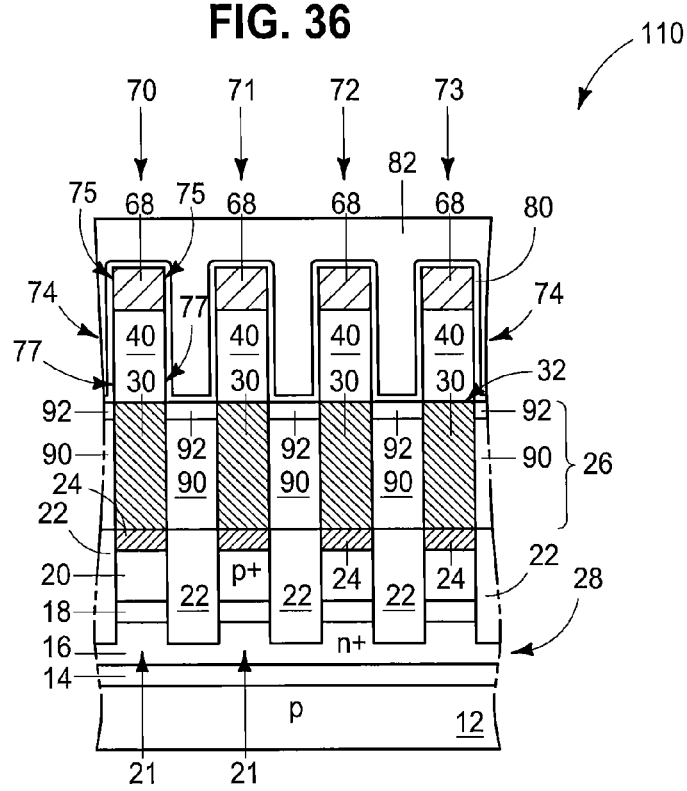

The construction of FIG. 34 has regions 89 (only some of which are labeled) where edges 63 of oxygen-sensitive material 40 approach the edge of an underlying node 32. In the shown embodiment, such edges 63 of material 40 do not extend to over the dielectric material 26. However, if there is some misalignment during the patterning of material 40, the edges 63 may extend to over material 26 which could lead to oxygen-induced poisoning of at least some regions of the structures 74 comprising material 40 in applications in which material 26 comprises oxygen. Accordingly, it may be desired for least the upper surface of material 26 to comprise a non-oxygen-containing composition, such as silicon nitride. FIGS. 35-37 show a construction 110 at a processing stage analogous to that of FIGS. 31-33, in accordance with an embodiment in which supporting material 26 comprises two different compositions 90 and 92. The lower composition 90 may contain oxygen, and the upper composition 92 may be a non-oxygen-containing composition, such as silicon nitride. The upper composition 92 may have any suitable thickness relative to the lower composition 90. Further, although material 26 is shown comprising only an upper region formed of a non-oxygen-containing composition, in other embodiments the entirety of material 26 may be a non-oxygen-containing composition.

The shown embodiment has upper regions of conductive material 30 entirely laterally surrounded by the non-oxygen-containing material 92, and thus has the nodes 32 entirely laterally surrounded by the non-oxygen-containing material 92. In some embodiments, the nodes 32 may be considered to extend into non-oxygen-containing material 92, and in the shown embodiment such nodes have top surfaces which are approximately coplanar with an upper surface of the non-oxygen-containing material 92. In other embodiments, the upper surface of material 92 may be above the top surfaces of the nodes, or below the top surfaces of the nodes.

In some embodiments, a memory cell (for instance, one of the cells 76 and 78 of FIG. 29) may be considered to comprise a phase change material structure 74 between a pair of electrical nodes (with one of the nodes corresponding to a node 30 beneath and directly against the phase change material structure, and the other of the nodes corresponding to a region of a bitline (for instance, one of the bitlines 70-73) which is over and directly against the phase change material structure). A non-oxygen-containing structure (i.e., a structure comprising non-oxygen-containing materials 38, 42 and 64) entirely encapsulates the phase change material structure except for regions of the phase change material structure that contact the electrodes.

The structures described above may be incorporated into any of numerous integrated circuit configurations, and such configurations may be utilized in electronic systems. The electronic systems may be used in any of numerous applications such as, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include a method of forming memory cells. A pair of spaced-apart electrical nodes is formed to be supported by a semiconductor substrate. The nodes are a first node and a second node. A patterning structure is formed over the nodes. The patterning structure spans the space between the nodes and has a first sidewall in opposing relation to a second sidewall. The first sidewall is directly over the first node and the second sidewall is directly over the second node.

The patterning structure comprises a first non-oxygen-containing material. Oxygen-sensitive material is formed along an exterior surface of the patterning structure. The oxygen-sensitive material is configured as a bridge extending from an upper surface of the first node to an upper surface of the second node. The bridge has a first segment along the first sidewall, a second segment along the second sidewall, and a third segment across a top of the patterning structure. Second non-oxygen-containing material is formed along the first, second and third segments of the oxygen-sensitive material bridge. At least some of the third segment of the phase change material bridge is removed to separate the first segment from the second segment. The first segment and first node are incorporated into a first memory cell. The second segment and second node are incorporated into a second memory cell which is adjacent to the first memory cell.

Some embodiments include a method of forming memory cells. A plurality of spaced-apart electrical nodes is formed to be supported by a semiconductor substrate. A plurality of spaced-apart patterning structures are formed over the nodes. The patterning structures span spaces between the nodes and have first sidewalls in opposing relation to second sidewalls. The patterning structures extend along a first direction. The first sidewalls are directly over first sets of nodes and the second sidewalls are directly over second sets of nodes. The patterning structures comprise a first non-oxygen-containing material. A film of phase change material is formed across the patterning structures and across spaces between the patterning structures. Second non-oxygen-containing material is formed across the film of phase change material. The phase change material is removed from over the patterning structures, and from between the patterning structures to leave lines of the phase change material along the sidewalls of the patterning structures. The phase change material lines are angled plates having horizontal portions directly against the nodes and having non-horizontal portions extending upwardly from the horizontal portions. Third non-oxygen-containing material is formed across the phase change material lines. The third non-oxygen-containing material is removed from over upper regions of the phase change material lines while leaving the third non-oxygen-containing material remaining along the lateral edges of the phase change material lines. Electrically conductive bitline material is formed across the upper regions of the phase change material lines. The bitline material is patterned into bitlines which extend along a second direction substantially orthogonal to the first direction. A pattern of the bitlines is transferred through the phase change material lines to slice the phase change material lines into phase change material structures that are in one-to-one correspondence with the nodes. Individual memory cells comprise a phase change material structure directly between a node and a bitline.

Some embodiments include a semiconductor construction having spaced-apart electrical nodes supported by a semiconductor substrate. Oxygen-sensitive material structures are directly over the nodes. Each oxygen-sensitive material structure comprises an angled plate, with the angled plate having a horizontal portion along a top surface of a node and a non-horizontal portion extending upwardly from the horizontal portion. Each angled plate has an interior sidewall, an exterior sidewall in opposing relation to the interior sidewall, and lateral edges. Bitlines are over the oxygen-sensitive material structures. The bitlines have sidewalls extending upwardly from the lateral edges of the oxygen-sensitive material structures. A non-oxygen-containing structure is along the interior sidewalls, along the exterior sidewalls, along the lateral edges, over the bitlines, and along the sidewalls of the bitlines.

Some embodiments include a memory cell comprising a phase change material structure between a pair of electrical nodes, and comprising a non-oxygen-containing structure entirely encapsulating the phase change material structure except for regions of the phase change material structure that contact the electrodes.

Some embodiments include a memory array having spaced-apart electrical nodes supported by a semiconductor substrate. The nodes are arranged along a grid comprising a first direction and a second direction, with the second direction being substantially orthogonal to the first direction. Phase change material structures are directly over the nodes. Each phase change material structure comprises an angled plate, with the angled plate having a horizontal portion along a top surface of a node and a non-horizontal portion extending upwardly from the horizontal portion. Each angled plate has an interior sidewall, an exterior sidewall in opposing relation to the interior sidewall, and lateral edges. The horizontal portions project along the first direction. The phase change structures are oriented edge-edge along the second direction, and are spaced from one another by gaps. The phase change structures are arranged along the first direction in a repeating pattern of interior sidewall/interior sidewall/exterior sidewall/exterior sidewall. Adjacent interior sidewalls are spaced from one another by a non-oxygen-containing structure and oxygen-containing material, with only the non-oxygen-containing structure being directly against the phase change material structures. Adjacent interior sidewalls are spaced from one another only by the non-oxygen-containing structure. Bitlines are over the phase change material structures. The bitlines have sidewalls extending upwardly from the lateral edges of the phase change material structures. The non-oxygen-containing structure extends over the bitlines and along the sidewalls of the bitlines.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor construction, comprising:
   oxygen-sensitive material structures supported by a semiconductor substrate; each oxygen-sensitive material structure comprising an angled plate, with the angled plate having a horizontal portion and a non-horizontal portion extending upwardly from the horizontal portion; each angled plate having an interior sidewall, an exterior sidewall in opposing relation to the interior sidewall and lateral edges extending form the interior sidewall to the exterior sidewall;
   bitlines over the oxygen-sensitive material structures; and
   a non-oxygen-containing structure along the interior sidewalls, along the exterior sidewalls and along the lateral edges; and
   wherein oxygen-containing material is directly against the non-oxygen-containing structure and spaced from the oxygen-sensitive material by intervening regions of the non-oxygen-containing structure.

2. The semiconductor construction of claim 1 wherein the bitlines have sidewalls extending upwardly from the lateral edges of the oxygen-sensitive material structures; and wherein the non-oxygen-containing structure is along the sidewalls of the bitlines.

3. The semiconductor construction of claim 2 wherein the non-oxygen-containing structure comprises silicon nitride.

4. A memory cell, comprising:
a phase change material structure between top and bottom electrical nodes, the phase change material structure having a substantially horizontal bottom plate region directly an contacting upper surface of the bottom electrical node and having a substantially vertical plate region extending upwardly from the substantially horizontal bottom plate region; the substantially vertical plate region directly contacting the bottom electrical node and directly contacting the top electrical node; and
a non-oxygen-containing structure entirely encapsulating the phase change material structure except for areas of the phase change material structure that contact the top and bottom electrical nodes; and
wherein the non-oxygen-containing structure is directly against an oxygen-containing material, and is between the oxygen-containing material and the phase change material structure.

5. The memory cell of claim 4 wherein the non-oxygen-containing structure comprises silicon nitride.

6. The memory cell of claim 4 wherein the phase change material comprises chalcogenide.

7. A memory array, comprising:
spaced-apart electrical nodes supported by a silicon-containing substrate; the nodes being arranged along a grid comprising a first direction and a second direction, with the second direction being substantially orthogonal to the first direction;
phase change material structures directly over the nodes; each phase change material structure comprising an angled plate, with the angled plate having a horizontal portion along a top surface of a node and a non-horizontal portion extending upwardly from the horizontal portion; each angled plate having an interior sidewall, an exterior sidewall in opposing relation to the interior sidewall, and lateral edges extending form the interior sidewall to the exterior sidewall; the horizontal portions projecting along the first direction; the phase change structures being oriented edge-edge along the second direction, and being spaced from one another by gaps; the phase change structures being arranged along the first direction in a repeating pattern of interior sidewall/interior sidewall/exterior sidewall/exterior sidewall; adjacent interior sidewalls being spaced from one another by a non-oxygen-containing structure and oxygen-containing material, with only the non-oxygen-containing structure being directly against the phase change material structures; adjacent interior sidewalls being spaced from one another only by the non-oxygen-containing structure;
bitlines over the phase change material structures; the bitlines having sidewalls extending upwardly from the lateral edges of the phase change material structures; and
the non-oxygen-containing structure extending over the bitlines and along the sidewalls of the bitlines.

8. The memory array of claim 7 wherein the non-oxygen-containing structure comprises silicon nitride.

9. The memory array of claim 7 wherein the nodes extend into an oxygen-containing dielectric material, and wherein the non-oxygen-containing structure extends across a surface of the dielectric material between the nodes.

* * * * *